(12) United States Patent
Li et al.

(10) Patent No.: US 9,747,854 B2
(45) Date of Patent: Aug. 29, 2017

(54) SHIFT REGISTER, GATE DRIVING CIRCUIT, METHOD FOR DRIVING DISPLAY PANEL AND DISPLAY DEVICE

(71) Applicants: BOE TECHNOLOGY GROUP CO., LTD., Beijing (CN); ORDOS YUANSHENG OPTOELECTRONICS CO., LTD., Ordos, Inner Mongolia (CN)

(72) Inventors: Fuqiang Li, Beijing (CN); Jun Fan, Beijing (CN); Xiaochuan Chen, Beijing (CN); Xue Dong, Beijing (CN)

(73) Assignees: BOE TECHNOLOGY GROUP CO., LTD., Beijing (CN); ORDOS YUANSHENG OPTOELECTRONICS CO., LTD., Ordos, Inner Mongolia (CN)

( * ) Notice: Subject to any disclaimer, the term of this patent is extended or adjusted under 35 U.S.C. 154(b) by 0 days.

(21) Appl. No.: 15/125,851

(22) PCT Filed: Jan. 8, 2016

(86) PCT No.: PCT/CN2016/070491
§ 371 (c)(1),
(2) Date: Sep. 13, 2016

(87) PCT Pub. No.: WO2017/020549
PCT Pub. Date: Feb. 9, 2017

(65) Prior Publication Data
US 2017/0178581 A1    Jun. 22, 2017

(30) Foreign Application Priority Data
Aug. 6, 2015 (CN) .......................... 2015 1 0477631

(51) Int. Cl.
G11C 19/00 (2006.01)
G09G 3/36 (2006.01)
G11C 19/28 (2006.01)

(52) U.S. Cl.
CPC ......... G09G 3/3655 (2013.01); G09G 3/3674 (2013.01); G09G 3/3611 (2013.01);
(Continued)

(58) Field of Classification Search
None
See application file for complete search history.

(56) References Cited

U.S. PATENT DOCUMENTS

2007/0177712 A1* 8/2007 Yu ........................... G11C 19/28
377/64
2008/0101529 A1* 5/2008 Tobita .................. G09G 3/3677
377/64
(Continued)

FOREIGN PATENT DOCUMENTS

CN        1424821 A      6/2003
CN        1848236 A     10/2006
(Continued)

OTHER PUBLICATIONS

International Search Report and Written Opinion dated Apr. 27, 2016; Appln. No. PCT/CN2016/070491.

*Primary Examiner* — Tuan T Lam
(74) *Attorney, Agent, or Firm* — Ladas & Parry LLP

(57) ABSTRACT

A shift register, a gate driving circuit, a display panel, a method for driving the display panel and a display device relate to a field of display technology. By aid of adding an output control unit, a second pull-up unit, a second pull-down unit and a selection control signal terminal on the basis of the shift register in the prior art, it can be controlled whether a scan signal should be outputted at a selection driving output terminal. In the gate driving circuit, through (Continued)

controlling the selection control signals applied on the selection control signal terminals, the scan signals can be outputted to a part of gate lines selectively. In the display panel provided in the embodiments of the present disclosure, besides the gate driving circuit, switch devices each of which is connected between third nodes of two shift registers, switch devices each of which is connected between fourth nodes of two shift registers and a mode switching circuit connected to the driving control circuit are incorporated. As such, the mode switching circuit can make the display panel display in different resolutions according to different mode control signals, such that the power consumption of the display panel can be reduced selectively to prolong standby time.

13 Claims, 16 Drawing Sheets

(52) U.S. Cl.
CPC ............... *G09G 2310/0278* (2013.01); *G09G 2310/0286* (2013.01); *G11C 19/28* (2013.01)

(56) References Cited

U.S. PATENT DOCUMENTS

| | | | | |
|---|---|---|---|---|
| 2008/0219401 A1* | 9/2008 | Tobita | ................. | G09G 3/3677 377/79 |
| 2009/0058790 A1* | 3/2009 | Chiang | ................. | G11C 19/28 345/100 |
| 2009/0175405 A1 | 7/2009 | Chen et al. | | |
| 2010/0109995 A1* | 5/2010 | Fang | ..................... | G09G 3/3677 345/100 |
| 2011/0216876 A1* | 9/2011 | Amano | ................. | G11C 19/184 377/75 |
| 2015/0016585 A1* | 1/2015 | Toyotaka | ............. | G11C 19/287 377/77 |
| 2015/0302934 A1* | 10/2015 | Qi | ........................ | G11C 19/184 377/54 |
| 2015/0339999 A1* | 11/2015 | Zheng | .................... | G11C 19/28 345/92 |
| 2017/0039968 A1* | 2/2017 | Chen | .................... | G09G 3/3648 |
| 2017/0039971 A1* | 2/2017 | Huang | ................. | G09G 3/3677 |

FOREIGN PATENT DOCUMENTS

| | | |
|---|---|---|
| CN | 101009090 A | 8/2007 |
| CN | 101136185 A | 3/2008 |
| CN | 102610185 A | 7/2012 |
| CN | 102819998 A | 12/2012 |
| CN | 103137081 A | 6/2013 |
| CN | 103578394 A | 2/2014 |
| CN | 103985366 A | 8/2014 |
| CN | 104966506 A | 10/2015 |
| CN | 104978943 A | 10/2015 |

\* cited by examiner

(12) United States Patent
US 9,747,854 B2

SHIFT REGISTER, GATE DRIVING CIRCUIT, METHOD FOR DRIVING DISPLAY PANEL AND DISPLAY DEVICE

TECHNICAL FIELD

The present disclosure relates to a field of display technology, and more particularly, to a shift register, a gate driving circuit, a display panel, a method for driving the display panel and a display device.

BACKGROUND

Today, with rapid development of science and technology, liquid crystal displays have been widely applied in electronic display products such as televisions, computers, mobile phones and personal digital assistances and so on. A liquid crystal display comprises a source driver, a gate driver, a liquid crystal display panel and so on. A pixel array is disposed on the liquid crystal display panel, the gate driver is configured to select respective pixel rows in the pixel array sequentially, so as to transmit pixel data outputted from the source driver to respective pixels in the pixel row currently selected by the gate driver, thus displaying an image to be displayed.

At present, the gate driver is formed on an array substrate of the liquid crystal display by a process of array, that is, a process of Gate Driver on Array GOA, such that cost may be saved and a beautiful design with two symmetric sides may be achieved for the panel. In addition, bonding area and fan-shaped wiring space for a gate Integrated Circuit IC may be omitted, such that a narrow frame design may be achieved, meanwhile a bonding process in the direction of gate scanning may be omitted, which is advantageous for the increasing of productivity and yield rate.

The gate driver is commonly constituted by a plurality of shift registers connected in cascade, driving signal output terminals of the respective shift registers correspond to respective gate lines respectively so as to output scan signals to the respective gate lines in a scanning direction sequentially. Particularly, structure of a shift register is shown in FIG. 1, and the shift register comprises an input unit 01, a reset unit 02, a node control unit 02, a pull-up unit 04, a pull-down unit 05, an input signal terminal Input, a reset signal terminal Reset, a first clock signal terminal ck and a reference signal terminal Vref. An output terminal of the input unit 01, an output terminal of the reset unit 02, a first terminal of the node control unit 03 and a control terminal of the first pull-up unit 04 are connected to a first node PU, a second terminal of the node control unit 03 and a control terminal of the first pull-up unit 05 are connected to a second node PD; an output terminal of the first pull-up unit 04 and an output terminal of the first pull-down unit 05 are connected to a driving signal output terminal Out of the shift register. In the shift register shown in FIG. 1, the input unit 01 is configured to control a level at the first node PU under a control of the input signal terminal Input, the reset unit 02 is configured to control the level at the first node PU under a control of the reset signal terminal Reset, the node control unit 03 is configured to control the level at the first node PU and a level at a second node PD, the first pull-up unit 04 is configured to supply a signal at the first clock signal terminal ck1 to the driving signal output terminal Output under a control of the first node PU, the first pull-down unit 5 is configured to supply a signal at the reference signal terminal Vref to the driving signal output terminal Out under a control of the second node PD.

At present, the shift register at each of respective stages in the gate driver in the display panel is generally as shown in FIG. 1, the display panel outputs scan signals to respective gate lines through the shift registers at respective stages in the scanning direction sequentially, With increasing of resolution of display product, a power consumption of the display panel also increases, rendering standby time of the display product is decreased hugely. Therefore, how to reduce power consumption of the display product to increase the standby time becomes an urgent technical problem to be solved for those skilled in the art.

SUMMARY

In embodiments of the present disclosure, there is provided a shift register, a gate driving circuit, a display panel, a method for driving the display panel, and a display device capable of reducing resolution of the display panel under special cases and thus reducing power consumption of the display panel.

The shift register provided in the embodiments of the present disclosure comprises: a first pull-up unit, a first pull-down unit, an output control unit, a second pull-up unit and a second pull-down unit, wherein the first pull-up unit is connected to a first node, a first clock signal terminal and a driving signal output terminal, and supplies a signal at the first clock signal terminal to the driving signal output terminal under a control of the first node; the first pull-down unit is connected to a second node, a reference signal terminal and the driving signal output terminal, and supplies a signal at the reference signal terminal to the driving signal output terminal under a control of the second node; the output control unit is connected to the first node, the second node, a selection control signal terminal, a third node and a fourth node, and connects the first node to the third node and connects the second node to the fourth node when the selection control signal terminal receives a selection control signal; the second pull-up unit is connected to the third node, the first clock signal terminal and a selection driving output terminal, and supplies the signal at the first clock signal terminal to the selection driving output terminal under a control of the third node; and the second pull-down unit is connected to the fourth node, the reference signal terminal and the selection driving output terminal, and supplies the signal at the reference signal terminal to the selection driving output terminal under a control of the fourth node.

In the shift register provided in the embodiments of the present disclosure, the output control unit comprises: a first switching transistor and a second switching transistor, wherein a gate of the first switching transistor is connected to the selection control signal terminal, a source of the first switching transistor is connected to the first node, and a drain of the first switching transistor is connected to the third node; a gate of the second switching transistor is connected to the selection control signal terminal, a source of the second switching transistor is connected to the second node, and a drain of the first switching transistor is connected to the fourth node.

In the shift register provided in the embodiments of the present disclosure, the second pull-up unit comprises: a third switching transistor, wherein a gate of the third switching transistor is connected to the third node, a source of the third switching transistor is connected to the first clock signal terminal, and a drain of the third switching transistor is connected to the selection driving output terminal.

In the shift register provided in the embodiments of the present disclosure, the second pull-down unit comprises: a fourth switching transistor, wherein a gate of the fourth switching transistor is connected to the fourth node, a source of the fourth switching transistor is connected to the reference signal terminal, and a drain of the fourth switching transistor is connected to the selection driving output terminal.

Accordingly, the gate driving circuit provided in the embodiments of the present disclosure comprises a plurality of shift registers connected in cascade, the shift register is any of the shift registers provided above, wherein the shift register further comprises an input unit and a reset unit, the input unit is connected to an input signal terminal and the first node, the reset unit is connected to a reset signal terminal and the first node; except the shift register at a last stage, the driving signal output terminal of the shift register at each stage is connected to the input signal terminal of the shift register at its adjacent next stage; the signal input terminal of the shift register at a first stage receives a trigger signal; except the shift register at the first stage, the driving signal output terminal of the shift register at each stage is connected to the reset signal terminal of the shift register at its adjacent previous stage; the selection driving output terminal of the shift register at each stage is connected to its corresponding gate line.

The gate driving circuit provided in the embodiments of the present disclosure further comprises: a plurality of first switch devices and a plurality of second switch devices, wherein a $k^{th}$ first switch device is connected to the first switch control terminal, the third node in the shift register at a $3k-2^{th}$ stage and the third node in the shift register at a $3k^{th}$ stage, and connects the third node in the shift register at the $3k-2^{th}$ stage to the third node in the shift register at the $3k^{th}$ stage under a control of the first switch control terminal; a $k^{th}$ second switch device is connected to the first switch control terminal, the fourth node in the shift register at a $3k-2^{th}$ stage and the fourth node in the shift register at a $3k^{th}$ stage, and connects the fourth node in the shift register at the $3k-2^{th}$ stage to the fourth node in the shift register at the $3k^{th}$ stage under a control of the first switch control terminal, wherein k is an integer larger than or equal to 1.

The gate driving circuit provided in the embodiments of the present disclosure further comprises: a plurality of third switch devices and a plurality of fourth switch devices, wherein a $n^{th}$ third switch device is connected to the second switch control terminal, the third node in the shift register at a $4n-3^{th}$ stage and the third node in the shift register at a $4n-1^{th}$ stage, and connects the third node in the shift register at the $4n-3^{th}$ stage to the third node in the shift register at the $4n-1^{th}$ stage under a control of the second switch control terminal; a $n^{th}$ fourth switch device is connected to the second switch control terminal, the fourth node in the shift register at a $4n-3^{th}$ stage and the fourth node in the shift register at a $4n-1^{th}$ stage, and connects the fourth node in the shift register at the $4n-3^{th}$ stage to the fourth node in the shift register at the $4n-1^{th}$ stage under a control of the second switch control terminal, wherein n is an integer larger than or equal to 1.

The gate driving circuit provided in the embodiments of the present disclosure further comprises: a plurality of fifth switch devices and a plurality of sixth switch devices, wherein a $n^{th}$ fifth switch device is connected to the third switch control terminal, the third node in the shift register at a $4n-2^{th}$ stage and the third node in the shift register at a $4n^{th}$ stage, and connects the third node in the shift register at the $4n-2^{th}$ stage to the third node in the shift register at the $4n^{th}$ stage under a control of the third switch control terminal; a $n^{th}$ sixth switch device is connected to the third switch control terminal, the fourth node in the shift register at a $4n-2^{th}$ stage and the fourth node in the shift register at a $4n^{th}$ stage, and connects the fourth node in the shift register at the $4n-2^{th}$ stage to the fourth node in the shift register at the $4n^{th}$ stage under a control of the third switch control terminal, wherein n is an integer larger than or equal to 1.

Accordingly, the display panel provided in the embodiments of the present disclosure comprises N gate lines and a first gate driving circuit and a second gate driving circuit located at both sides of the display panel and connected to the N gate lines; the first gate driving circuit and the second gate driving circuit are the gate driving circuit described above, the selection driving output terminal of each of the shift registers in each of the gate driving circuits is connected to its corresponding gate line. The display panel further comprises a driving control circuit, wherein the driving control circuit is connected to the first gate driving circuit and the second gate driving circuit, outputs the selection control signal to the first gate driving circuit and the second gate driving circuit, outputs a first group of timing control signals to the first gate driving circuit, and outputs a second group of timing control signals to the second gate driving circuit, wherein the first group of timing control signals at least comprise a first trigger signal and a first clock signal, the second group of timing control signals at least comprise a second trigger signal and a third clock signal, a width of the first trigger signal is same as a width of the second trigger signal, the first gate driving circuit outputs scan signals at the driving signal output terminals of the shift registers at respective stages sequentially under a control of the first group of timing control signals, the second gate driving circuit outputs scan signals at the driving signal output terminals of the shift registers at respective stages sequentially under a control of the second group of timing control signals.

Preferably, the display panel provided in the embodiments of the present disclosure further comprises: a mode switching circuit connected to the driving control circuit, wherein upon receipt of a first mode control circuit, the mode switching circuit controls the driving control circuit to make timings of signals in the first group of timing control signals be delayed a width of a trigger signal relative to timings of corresponding signals in the second group of timing control signals; and controls the driving control circuit to output the selection control signal to the selection control signal terminals of the shift registers at odd stages in the first gate driving circuit and output the selection control signal to the selection control signal terminals of the shift registers at even stages in the second gate driving circuit.

Preferably, in the above display panel provided in the embodiments of the present disclosure, the first gate driving circuit comprises a plurality of first switch devices and a plurality of second switch devices, upon receipt of a second mode control signal, the mode switching circuit controls all of the first switch devices and the second switch devices in an ON state, controls the driving control circuit to make timings of signals in the second group of timing control signals be delayed a width of a trigger signal relative to timings of corresponding signals in the first group of timing control signals; and controls the driving control circuit to output the selection control signal to the selection control signal terminals of the shift registers at $3k^{th}$ stages in the first gate driving circuit and output the selection control signal to the selection control signal terminals of the shift registers at $3k-1^{th}$ stages in the second gate driving circuit.

Preferably, in the above display panel provided in the embodiments of the present disclosure, the first gate driving circuit comprises a plurality of third switch devices and a plurality of fourth switch devices, the second gate driving circuit comprises a plurality of fifth switch devices and a plurality of sixth switch devices, upon receipt of a third mode control signal, the mode switching circuit controls all of the third switch devices, the fourth switch devices, the fifth switch devices and the sixth switch devices in an ON state, controls the driving control circuit to make timings of signals in the first group of timing control signals be delayed a width of a trigger signal relative to timings of corresponding signals in the second group of timing control signals; and controls the driving control circuit to output the selection control signal to the selection control signal terminals of the shift registers at 4n-1$^{th}$ stages in the first gate driving circuit and output the selection control signal to the selection control signal terminals of the shift registers at 4n$^{th}$ stages in the second gate driving circuit.

Preferably, in the above display panel provided in the embodiments of the present disclosure, upon receipt of a fourth mode control signal, the mode switching circuit controls all of the switch devices in an OFF state, controls the driving control circuit to make timings of signals in the second group of timing control signals be same as timings of corresponding signals in the first group of timing control signals; and controls the driving control circuit to output the selection control signal to the selection control signal terminals of all of the shift registers.

Accordingly, the display device provided in the embodiments of the present disclosure comprises any of the display panel provided above in the embodiments of the present disclosure.

Accordingly, the method for driving the display panel provided in the embodiments of the present disclosure comprises:

upon receipt of a first mode control circuit, the mode switching circuit controls all of the switch devices in an OFF state, controls the driving control circuit to make timings of signals in the first group of timing control signals be delayed a width of a trigger signal relative to timings of corresponding signals in the second group of timing control signals, and controls the driving control circuit to output the selection control signal to the selection control signal terminals of the shift registers at odd stages in the first gate driving circuit and output the selection control signal to the selection control signal terminals of the shift registers at even stages in the second gate driving circuit;

upon receipt of a second mode control signal, the mode switching circuit controls all of the first switch devices and the second switch devices in an ON state, controls all of the third switch devices, the fourth switch devices, the fifth switch devices and the sixth switch devices in an OFF state, controls the driving control circuit to make timings of signals in the second group of timing control signals be delayed a width of a trigger signal relative to timings of corresponding signals in the first group of timing control signals, and controls the driving control circuit to output the selection control signal to the selection control signal terminals of the shift registers at 3k$^{th}$ stages in the first gate driving circuit and output the selection control signal to the selection control signal terminals of the shift registers at 3k-1$^{th}$ stages in the second gate driving circuit;

upon receipt of a third mode control signal, the mode switching circuit controls all of the first switch devices and the second switch devices in an OFF state, controls all of the third switch devices, the fourth switch devices, the fifth switch devices and the sixth switch devices in an ON state, controls the driving control circuit to make timings of signals in the first group of timing control signals be delayed a width of a trigger signal relative to timings of corresponding signals in the second group of timing control signals, and controls the driving control circuit to output the selection control signal to the selection control signal terminals of the shift registers at 4n-1$^{th}$ stages in the first gate driving circuit and output the selection control signal to the selection control signal terminals of the shift registers at 4n$^{th}$ stages in the second gate driving circuit;

upon receipt of a fourth mode control signal, the mode switching circuit controls all of the switch devices in an OFF state, controls the driving control circuit to make timings of signals in the second group of timing control signals be same as timings of corresponding signals in the first group of timing control signals, and controls the driving control circuit to output the selection control signal to the selection control signal terminals of all of the shift registers.

In the shift register, the gate driving circuit, the display panel and the method for driving the display panel provided in the embodiments of the present disclosure, the output control unit, the second pull-up unit, the second pull-down unit and the selection control signal terminal are added on the basis of the shift register in the prior art, wherein the output control unit is configured to connect the first node to the third node and connects the second node to the fourth node when the selection control signal terminal receives the selection control signal, the second pull-up unit is configured to supply the signal at the first clock signal terminal to the selection driving output terminal under the control of the third node, the second pull-down unit is configured to supply the signal at the reference signal terminal to the selection driving output terminal under the control of the fourth node. Dependent on the control of the output control unit, the second pull-up unit, the second pull-down unit and the selection control signal terminal, it is determined whether a driving output terminal should output a scan signal. In the gate driving circuit constituted by the above shift registers, the scan signal can be outputted to a part of gate lines selectively. In the display panel provided in the embodiments of the present disclosure which adopts the above gate driving circuit, switch devices each of which is connected between the third nodes of two shift registers, switch devices each of which is connected between the fourth nodes of two shift registers and the mode switching circuit connected to the driving control circuit are incorporated. As such, when the mode switching circuit receives different mode control signals, it makes the display panel display in different resolutions, such that the power consumption of the display panel can be reduced selectively to prolong standby time.

BRIEF DESCRIPTION OF THE DRAWINGS

FIG. 10d is a schematic diagram showing a partial amplification of the display panel shown in FIG. 10a;

DETAILED DESCRIPTION

With reference to accompanying drawings, implementations of a shift register, a gate driving circuit, a display panel, a method for driving the display panel and a display device provided in the embodiments of the present disclosure will be described below in detail.

Description will be given to the shift register provided in the embodiments of the present disclosure at first.

Figure 1:
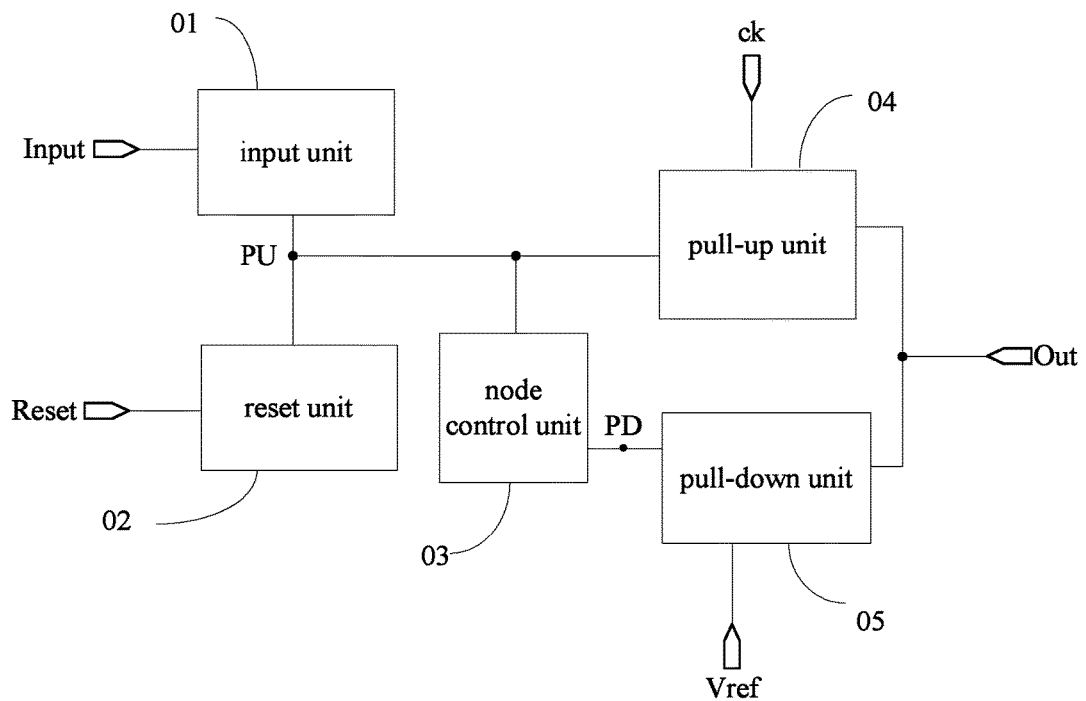
FIG. 1 is a schematic diagram showing structure of a shift register in the prior art.
Figure 2:
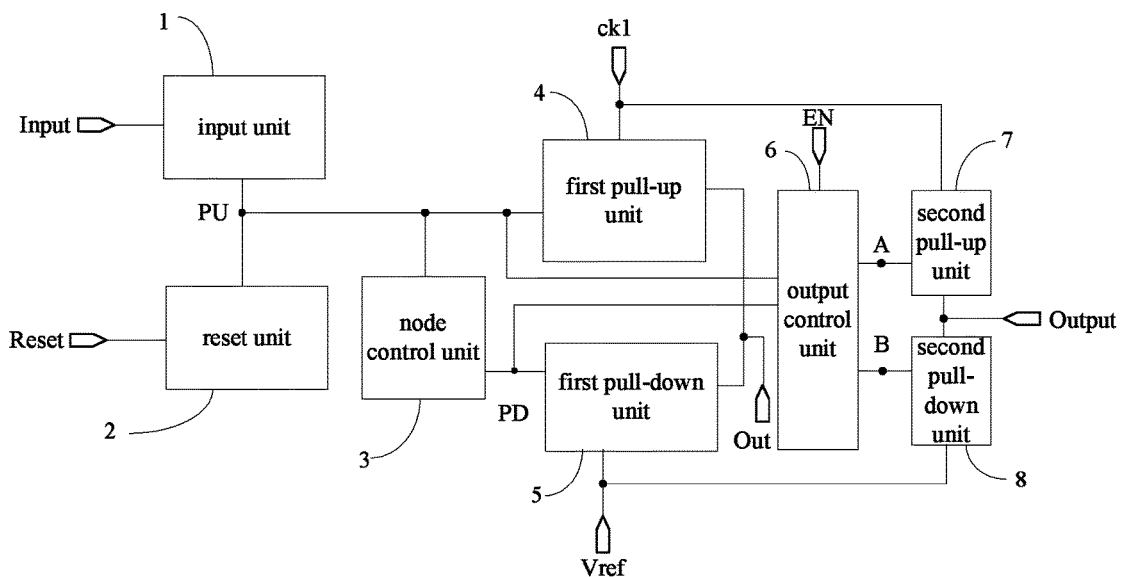
FIG. 2 is a first schematic diagram showing structure of a shift register provided in embodiments of the present disclosure.

As shown in FIG. 2, the shift register provided in the embodiments of the present disclosure comprises: an input unit 1, a reset unit 2, a node control unit 3, a first pull-up unit 4, a first pull-down unit 5, an input signal terminal Input, a reset signal terminal Reset, a first clock signal terminal ck1 and a reference signal terminal Vref, wherein an output terminal of the input unit 1, an output terminal of the reset unit 2, a first terminal of the node control unit 3 and a control terminal of the first pull-up unit 4 are connected to a first node PU, a second terminal of the node control unit 3 and a control terminal of the first pull-up unit 5 are connected to a second node PD; an output terminal of the first pull-up unit 4 and an output terminal of the first pull-down unit 5 are connected to a driving signal output terminal Out of the shift register.

Particularly, the input unit 1 is configured to control a level at the first node PU under a control of the input signal terminal Input, the reset unit 2 is configured to control the level at the first node PU under a control of the reset signal terminal Reset, the node control unit 3 is configured to control the level at the first node PU and a level at a second node PD, the first pull-up unit 4 is configured to supply a signal at the first clock signal terminal ck1 to the driving signal output terminal Output under a control of the first node PU, the first pull-down unit 5 is configured to supply a signal at the reference signal terminal Vref to the driving signal output terminal Out under a control of the second node PD.

In addition, as shown in FIG. 2, the shift register further comprises: an output control unit 6, a second pull-up unit 7, a second pull-down unit 8 and a selection control signal terminal EN. A first input terminal of the output control unit 6 is connected to the first node PU, a second input terminal of the output control unit 6 is connected to the second node PD, a third input terminal of the output control unit 6 is connected to the selection control signal terminal EN, a first output terminal of the output control unit 6 is connected to a third node A and a first input terminal of the second pull-up unit 7, a second output terminal of the output control unit 6 is connected to a fourth node B and a first input terminal of the second pull-down unit 8. A second input terminal of the second pull-up unit 7 is connected to the first clock signal terminal ck1, an output terminal of the second pull-up unit 7 is connected to an output terminal of the second pull-down unit 8 and functions as a selection driving output terminal Output of the shift register, a second input terminal of the second pull-down unit 8 is connected to the reference signal terminal Vref.

Particularly, the output control unit 6 is configured to connect the first node PU to the third node A and connect the second node PD to the fourth node B when the selection control signal terminal EN receives a selection control signal; the second pull-up unit 7 is configured to supply a signal at the first clock signal terminal ck1 to the selection driving output terminal Output under a control of the third node A; the second pull-down unit 8 is configured to supply a signal at the reference signal terminal Vref to the selection driving output terminal Output under a control of the fourth node B.

In the shift register provided in the embodiments of the present disclosure, an output control unit, a second pull-up unit, a second pull-down unit and a selection control signal terminal are added on basis of an existing shift register. The output control unit is configured to connect the first node to the third node and connect the second node to the fourth node when the selection control signal terminal receives a selection control signal; the second pull-up unit is configured to supply a signal at the first clock signal terminal ck to the selection driving output terminal Output under a control of the third node; the second pull-down unit is configured to supply a signal at the reference signal terminal to the selection driving output terminal Output under a control of the fourth node. Therefore, the driving output terminal can be controlled by the output control unit, the second pull-up unit, the second pull-down unit and the selection control signal terminal to output or not output a scanning signal. As a result, in a gate driving circuit constituted by the above shift register, it can be achieved to output scanning signals to partial gate lines selectively.

Below, detailed description will be given with reference to specific embodiments of the present disclosure. It should be explained that the embodiment is provided to illustrate the present disclosure better rather than to give any limitation to the present disclosure.

Figure 3:
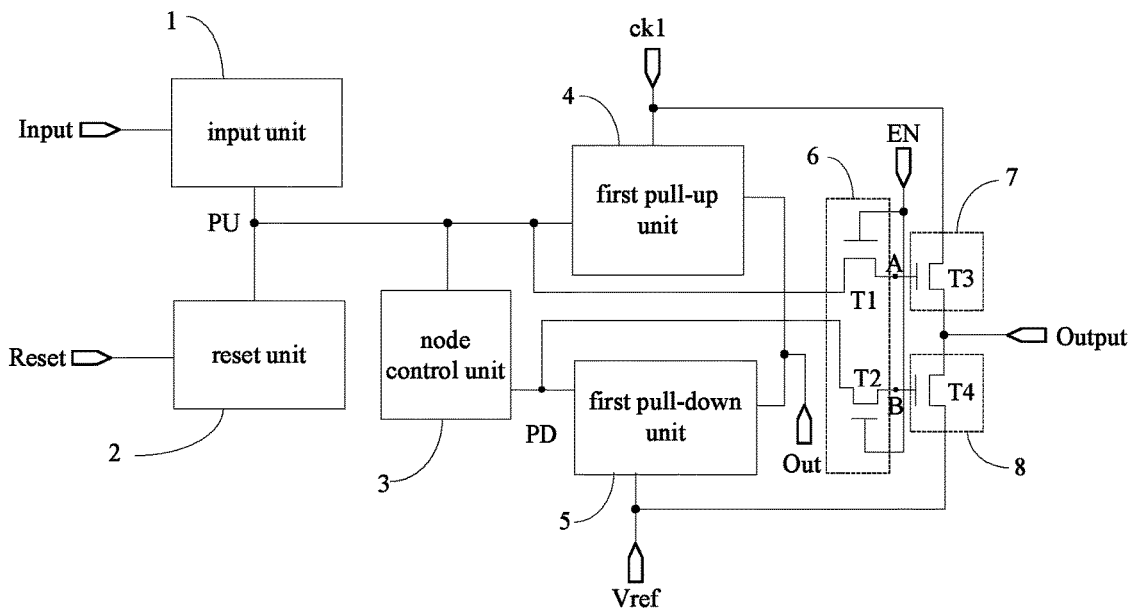
FIG. 3 is a second schematic diagram showing structure of a shift register provided in the embodiments of the present disclosure.

Preferably, in the shift register provided in the embodiments of the present disclosure, as shown in FIG. 3, the output control unit 6 may comprise a first switching transistor T1 and a second switching transistor T2. A gate of the first switching transistor T1 is connected to the selection control signal terminal EN, a source of the first switching transistor T1 is connected to the first node PU, a drain of the first switching transistor T1 is connected to the third node A. A gate of the second switching transistor T2 is connected to the selection control signal terminal EN, a source of the second switching transistor T2 is connected to the second node PD, and a drain of the second switching transistor T2 is connected to the fourth node B.

In the shift register provided in the embodiments of the present disclosure, when the selection control signal terminal EN controls the first switching transistor T1 and the second switching transistor T2 to be in an ON state, the first node PU and the third node A are connected, and the second node PD and the fourth node B are connected.

In specific implementation, both the first switching transistor T1 and the second switching transistor T2 may be P type transistors, or may be N type transistors, no limitation is made herein.

Above only illustrates a specific structure of the output control unit in the shift register, and the specific structure of the output control unit is not limited to the above structure provided in the embodiments of the present disclosure in specific implementations and may be other structure known by those skilled in the art, no limitation is made herein.

Preferably, in the shift register provided in the embodiments of the present disclosure, as shown in FIG. 3, the second pull-up unit 7 may comprise a third switching transistor T3. A gate of the third switching transistor T3 is connected to the third node A, a source of the third switching transistor T3 is connected to the first clock signal terminal ck1, a drain of the third switching transistor T3 is connected to the selection driving output terminal Output.

In the shift register provided in the embodiments of the present disclosure, when the third switching transistor T3 is controlled by the third node A to be in an ON state, the third switching transistor T3 supplies the signal at the first clock signal terminal ck1 to the selection driving output terminal.

Above only illustrates a specific structure of the second pull-up unit in the shift register, and the specific structure of the second pull-up unit is not limited to the above structure provided in the embodiments of the present disclosure in specific implementations and may be other structure known by those skilled in the art, no limitation is made herein.

Preferably, in the shift register provided in the embodiments of the present disclosure, as shown in FIG. 3, the second pull-down unit 8 may comprise a fourth switching transistor T4. A gate of the fourth switching transistor T4 is connected to the fourth node B, a source of the fourth switching transistor T4 is connected to the reference signal terminal Vref, a drain of the fourth switching transistor T4 is connected to the selection driving output terminal Output.

In the shift register provided in the embodiments of the present disclosure, when the fourth switching transistor T4 is controlled by the fourth node B to be in an ON state, the fourth switching transistor T4 supplies the signal at the reference signal terminal Vref to the selection driving output terminal Output.

Above only illustrates a specific structure of the second pull-down unit in the shift register, and the specific structure of the second pull-down unit is not limited to the above structure provided in the embodiments of the present disclosure in specific implementations and may be other structure known by those skilled in the art, no limitation is made herein.

Particularly, in the above shift register provided in the embodiments of the present disclosure, the node control unit is configured to control the level at the second node PD according to the level at the first node PU and control the level at the first node PU according to the level at the second node PD, such that a basic function of the shift register can be achieved by controlling the levels at the first node PU and the second node PD.

Furthermore, in the shift register provided in the embodiments of the present disclosure, structures of the input unit 1, the reset unit 2, the node control unit 3, the first pull-up unit 4 and the first pull-down unit 5 are same as those in the prior art, detailed descriptions are omitted herein. A specific embodiment will be described below, but the embodiments of the present disclosure are not so limited.

First Embodiment

Figure 4:
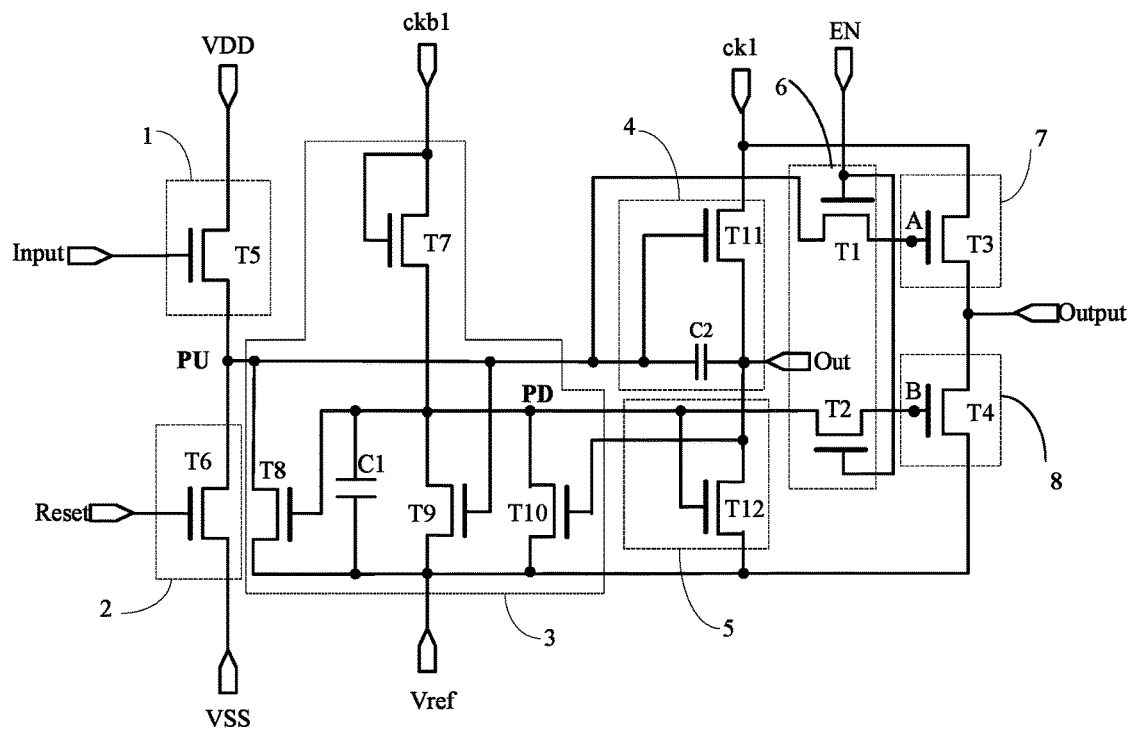
FIG. 4 is a schematic diagram showing particular structure of a shift register provided in the embodiments of the present disclosure.

Particularly, as shown in FIG. 4, the input unit 1 may comprise a fifth switching transistor T5, the reset unit 2 may comprise a sixth switching transistor T6, the node control unit 3 may comprise a seventh switching transistor T7, an eighth switching transistor T8, a ninth switching transistor T9, a tenth switching transistor T10 and a first capacitor C1; the first pull-up unit 4 may comprise an eleventh switching transistor T11 and a second capacitor C2, the first pull-down unit 5 may comprise a twelfth transistor T12.

A gate of the fifth switching transistor T5 is connected to the input signal terminal Input, a source of the fifth switching transistor T5 is connected to a first DC signal terminal VDD, a drain of the fifth switching transistor T5 is connected to the pull-up node PU. A gate of the sixth switching transistor T6 is connected to the reset signal terminal Reset, a source of the sixth switching transistor T6 is connected to a second DC signal terminal VSS, a drain of the sixth switching transistor T6 is connected to the first node PU. A gate and a source of the seventh switching transistor T7 are connected to a second clock signal terminal ckb1, and a drain of the seventh switching transistor T7 is connected to the second node PD. A gate of the eighth switching transistor T8 is connected to the second node PD, a source of the eighth switching transistor T8 is connected to the reference signal terminal Vref, and a drain of the eighth switching transistor T8 is connected to the first node PU. A gate of the ninth switching transistor T9 is connected to the first node PU, a source of the ninth switching transistor T9 is connected to the reference signal terminal Vref, a drain of the ninth switching transistor T9 is connected to the second node PD. A gate of the tenth switching transistor T10 is connected to the driving signal output terminal Out, a source of the tenth switching transistor T10 is connected to the reference signal terminal Vref, a drain of the tenth switching transistor T10 is connected to the second node PD. A gate of the eleventh switching transistor T11 is connected to the first node PU, a source of the eleventh switching transistor T11 is connected to the first clock signal terminal ck1, a drain of the eleventh switching transistor T11 is connected to the driving signal output terminal Out. A gate of the twelfth switching transistor T12 is connected to the second node PD, a source of the twelfth switching transistor T12 is connected to the reference signal terminal Vref, a drain of the twelfth switching transistor T12 is connected to the driving signal output terminal Out. The first capacitor C1 is connected between the second node PD and the reference signal terminal Vref, the second capacitor C2 is connected between the first node PU and the driving signal output terminal Out.

Particularly, all of the switching transistors in FIG. 4 are N type transistors, or all of the switching transistors in FIG. 4 are P type transistors, or partial switching transistors in FIG. 4 are N type transistors and other partial switching transistors in FIG. 4 are P type transistors, no limitation is made herein.

Figure 5:
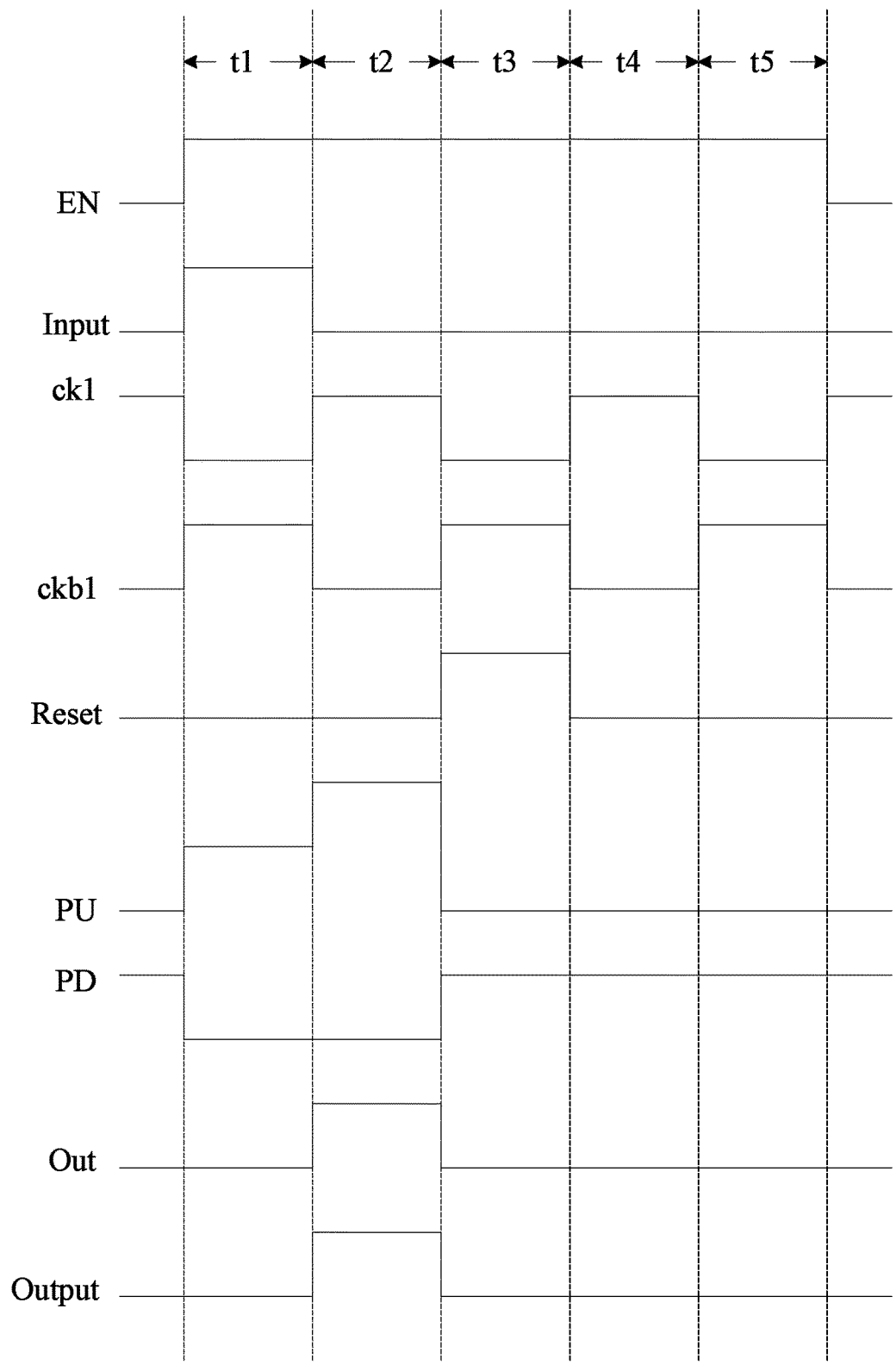
FIG. 5 is a diagram showing timings of signals of the shift register as shown in FIG. 4.

Particularly, operational principle of the shift register provided in the embodiments of the present disclosure will be described by taking the shift register shown in FIG. 4 as an example. A corresponding operational timing sequence is shown in FIG. 5 and can be divided into five periods: t1, t2, t3, t4 and t5. In the following description, 1 represents a high level signal, 0 represents a low level signal.

During a first period t1, Input=1, ck1=0, ckb1=1, Reset=0, EN=1.

Since Input=1, the fifth switching transistor T5 is turned on such that the level at the first node PU is at a high level, the eleventh switching transistor T11 is turned on, and the level at the driving signal output terminal Out is at a low level. Since ckb1=1, the seventh switching transistor T7 is turned on, meanwhile since the level at the first node PU is at a high level, the ninth switching transistor T9 is turned on, the level at the second node PD is at a low level. Since EN=1, the first switching transistor T1 and the second switching transistor T2 are turned on, the level at the third node A is at a high level, the third switching transistor T3 is turned on, and the level at the selection driving output terminal Output is at a low level.

During a second period t2, Input=0, ck1=1, ckb1=0, Reset=0, EN=1.

Since ck1=1, the level at the first node PU is further pulled up due to the bootstrapping effect of the second capacitor, the eleventh switching transistor T11 keeps to be turned on, the level at the driving signal output terminal Out is at a high level. Since the first node PU is at a high level, the ninth switching transistor T9 is turned on, the second node PD is at a low level. Since the driving signal output terminal Out is at a high level, the tenth switching transistor T10 is turned on, the second node PD is at a low level. Since EN=11, the first switching transistor T1 and the second switching transistor T2 are turned on, the third node A is at a high level, the third switching transistor T3 is turned on, and the selection driving output terminal Out is at a high level.

During a third period t3, Input=0, ck1=0, ckb1=1, Reset=1, EN=1.

Since Reset=1, the sixth switching transistor T6 is turned on, the first node PU is at a low level. Since ckb1=1, the seventh switching transistor T7 is turned on, the second node PD is at a high level, the twelfth switching transistor T12 is turned on, the driving signal output terminal Out is at a low level. Since the second node PD is at a high level, the eighth switching transistor T8 is turned on, the first node PU is at a low level. Since EN=1, the first switching transistor T1 and the second switching transistor T2 are turned on, the fourth node B is at a high level, the fourth switching transistor T4 is turned on, the selection driving output terminal Out is at a low level.

During a fourth period t4, Input=0, ck1=1, ckb1=0, Reset=0, EN=1.

The second node PD keeps at a high level due to the function of the first capacitor C1, the twelfth switching transistor T12 is turned on, the driving signal output terminal Out is at a low level. Since the second node PD is at a high level, the eighth switching transistor T8 is turned on, the first node PU is at a low level. Since EN=1, the first switching transistor T1 and the second switching transistor T2 are turned on, the fourth node B is at a high level, the fourth switching transistor T4 is turned on, the selection driving output terminal Output is at a low level.

During a fifth period t5, Input=0, ck1=0, ckb1=1, Reset=0, EN=1.

Since ckb1=1, the seventh switching transistor T7 is turned on, the second node PD is at a high level, the twelfth switching transistor T12 is turned on, the driving signal output terminal Out is at a low level. Since the second node PD is at a high level, the eighth switching transistor T8 is at a high level, the first node PU is at a low level. Since EN=1, the first switching transistor T1 and the second switching transistor T2 are turned on, the fourth node B is at a high level, the fourth switching transistor T4 is turned on, the selection driving output terminal Output is at a low level.

Then, before the input signal terminal Input turns to a high level again, the shift register repeats the fourth period and the fifth period.

It should be explained that the switching transistors mentioned above may be Thin Film Transistors TFTs, or may be Metal Oxide Semiconductors MOS, no limitation is made herein. In specific implementation, sources and drains of the switching transistors may be exchangeable in functions according to different types of transistors and different input signals, no distinction is made therebetween.

Figure 6:
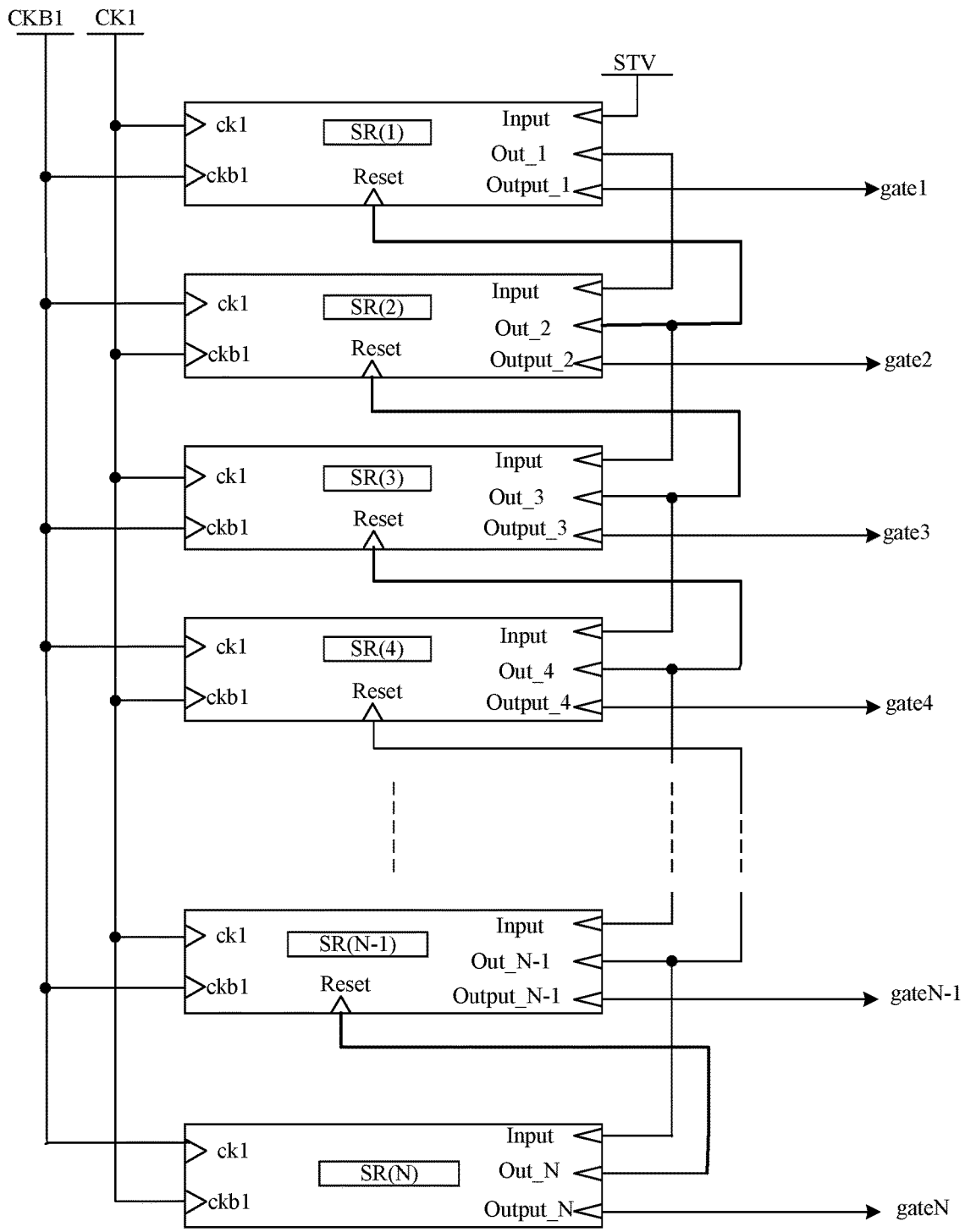
FIG. 6 is a schematic diagram showing structure of a gate driving circuit provided in the embodiments of the present disclosure.

Based on a same inventive concept, there is further provided a gate driving circuit in the embodiments of the present disclosure. As shown in FIG. 6, the gate driving circuit provided in the embodiments of the present disclosure comprises a plurality of above shift registers connected in cascade: SR(1), SR(2), . . . , SR(N−1), SR(N) (there are N shift registers in total).

Except the shift register at a last stage SR(N), the driving signal output terminal OUT_m of the shift register at each stage SR(m) (1≤m≤N) is connected to the input signal terminal Input of the shift register at its adjacent next stage SR(m+1).

The signal input terminal Input of the shift register at a first stage SR(1) receives a trigger signal; except the shift register at the first stage SR(1), the driving signal output terminal OUT_m of the shift register at each stage SR(m) is connected to the reset signal terminal Reset of the shift register at its adjacent previous stage SR(m−1).

The selection driving output terminal Output_m of the shift register at each stage SR(m) is connected to its corresponding gate line.

The gate driving circuit outputs scan signals to corresponding gate lines sequentially by connecting the selection driving output terminal Output_m of the shift register at each stage SR(m) is connected to its corresponding gate line gatem.

Furthermore, in the gate driving circuit provided in the embodiments of the present disclosure, as shown in FIG. 6, first clock signal terminals ck1 in the shift registers at odd stages and second clock signal terminals ckb1 in the shift registers at even stages generally receive a same clock signal (CK1 as shown in FIG. 6); and second clock signal terminals ckb1 in the shift registers at odd stages and first clock signal terminals ck1 in the shift registers at even stages generally receive a same clock signal (CKB1 as shown in FIG. 6).

Figure 7:
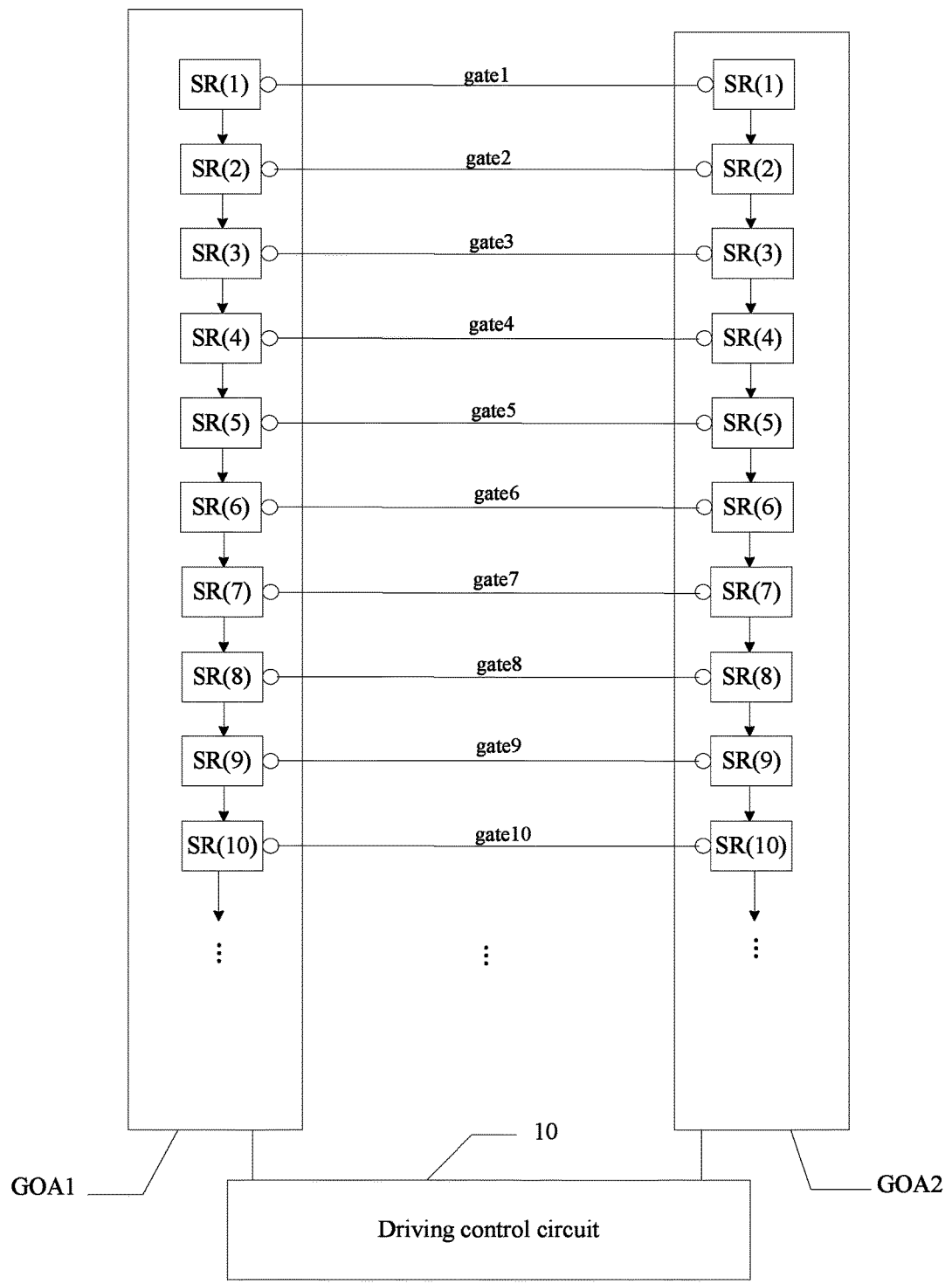
FIG. 7 is a first schematic diagram showing structure of a display panel provided in the embodiments of the present disclosure.

Based on a same inventive concept, there is further provided a display panel in the embodiments of the present disclosure. As shown in FIG. 7, the display panel comprises N gate lines (gate1, gate2, gate3 . . . ) and a first gate driving circuit GOA1 and a second gate driving circuit GOA2 located at both sides of the display panel respectively and connected to the N gate lines; the first gate driving circuit GOA1 and the second gate driving circuit GOA2 are the gate driving circuit provided in the embodiments of the present disclosure, the selection driving output terminal Output_m of the shift register SR(m) in each of the gate driving circuits is connected to its corresponding gate line.

The display panel further comprises a driving control circuit 10, wherein the driving control circuit 10 is connected to the first gate driving circuit GOA1 and the second gate driving circuit GOA2, at least outputs the selection control signal to the first gate driving circuit GOA1 and the second gate driving circuit GOA2, outputs a first group of timing control signals (at least comprising a first trigger signal STV1, a first clock signal CK1 and a second clock signal CKB1) to the first gate driving circuit GOA1, and outputs a second group of timing control signals (at least comprising a second trigger signal STV2, a third clock signal CK2 and a fourth clock signal CKB2) to the second gate driving circuit GOA2, wherein each group of timing control signals at least comprise a trigger signal and a clock signal, the trigger signal in each group of timing control signals has a same width, each of the first gate driving circuits GOA1 and the second gate driving circuit GOA2 outputs scan signals at its driving signal output terminals Out sequentially under a control of the received corresponding group of timing control signals.

Below, control of a group of timing control signals on a gate driving circuit will be described by taking the first gate driving circuit GOA1 as an example. The first gate driving circuit GOA1 is as shown in FIG. 6, the driving control circuit inputs a first trigger signal STV1 to the shift register at a first stage SR(1); inputs a first clock signal CK1 to the first clock signal terminals ck1 of the shift registers at odd stages and the second clock signal terminals ckb1 of the shift registers at even stages; and inputs a second clock signal CKB1 to the second clock signal terminals ckb1 of the shift registers at odd stages and the first clock signal terminals ck1 of the shift registers at even stages.

Figure 8:
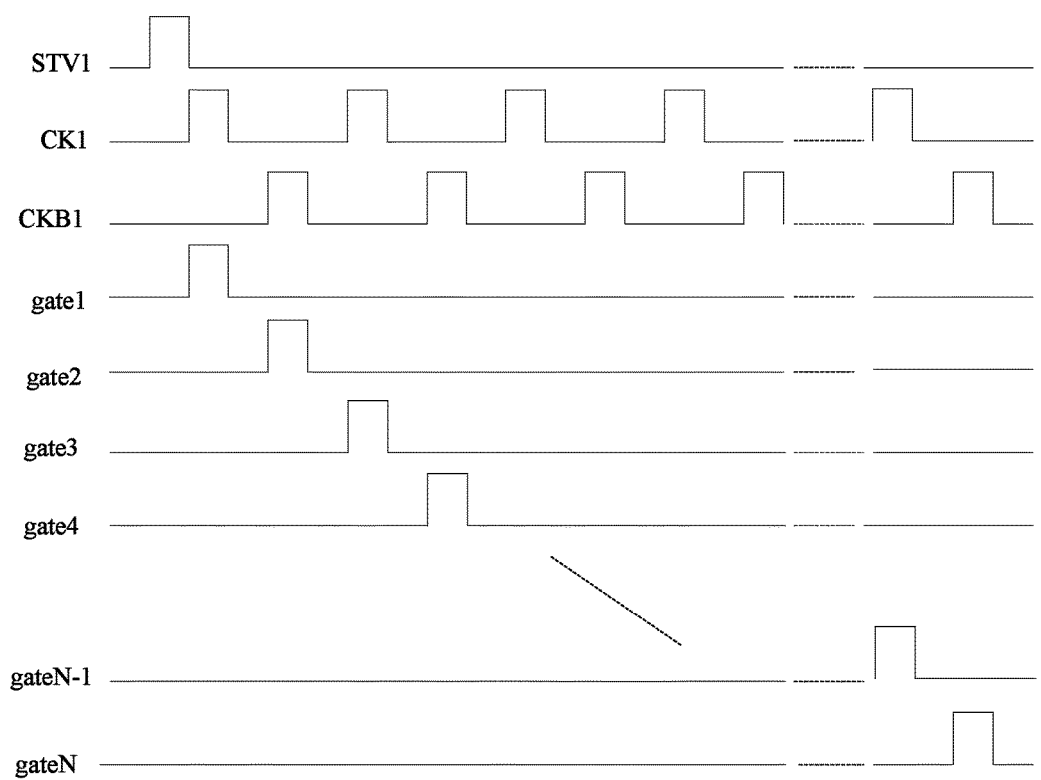
FIG. 8 is a diagram showing timings of signals of a first gate driving circuit provided in the embodiments of the present disclosure.

After the shift register at the first stage SR(1) receives the first trigger signal STV1, the driving signal output terminal Out_1 outputs a scan signal when its first clock signal terminal ck1 receives the first clock signal CK1 for a first time, and if the corresponding output control unit is in an ON state, the selection driving output terminal Output_1 outputs the scan signal to the first gate line gate1, and the scan signal outputted at the driving signal output terminal Out_1 of the shift register at the first stage SR(1) is supplied to the input signal terminal Input of the shift register at the second stage SR(2); after the shift register at the second stage SR(2) receives the scan signal outputted from the shift register at the first stage SR(1), the driving signal output terminal Out_2 outputs a scan signal when its first clock signal terminal ck1 receives the second clock signal CKB1 for a first time, and if the corresponding output control unit is in an ON state, the selection driving output terminal Output_2 outputs the scan signal to the second gate line gate2, and the scan signal outputted at the driving signal output terminal Out_2 of the shift register at the second stage SR(2) is supplied to the input signal terminal Input of the shift register at the third stage SR(3); after the shift register at the second stage SR(3) receives the scan signal outputted from the shift register at the first stage SR(2), the driving signal output terminal Out_3 outputs a scan signal when its first clock signal terminal ck1 receives the first clock signal CK1 for a first time, and if the corresponding output control unit is in an ON state, the selection driving output terminal Output_3 outputs the scan signal to the third gate line gate3, and the scan signal outputted at the driving signal output terminal Out_3 of the shift register at the third stage SR(3) is supplied to the input signal terminal Input of the shift register at the fourth stage SR(4). In the same manner, the shift registers at the respective stages output scan signals to corresponding gate lines sequentially. Specifically, a diagram of timing sequence of input signals and output signals corresponding to the first gate driving circuit GOA1 is shown in FIG. 8.

In addition, the driving control circuit 10 inputs a second trigger signal to the shift register at the first stage of the second gate driving circuit GOA2; inputs a third clock signal to the first clock signal terminals of the shift registers at odd stages and the second clock signal terminals of the shift registers at even stages; and inputs a fourth clock signal to the second clock signal terminals of the shift registers at odd stages and the first clock signal terminals of the shift registers at even stages. The operational principle of the second gate driving circuit is same as that of the first gate driving circuit, detailed omitted.

Figure 9A:
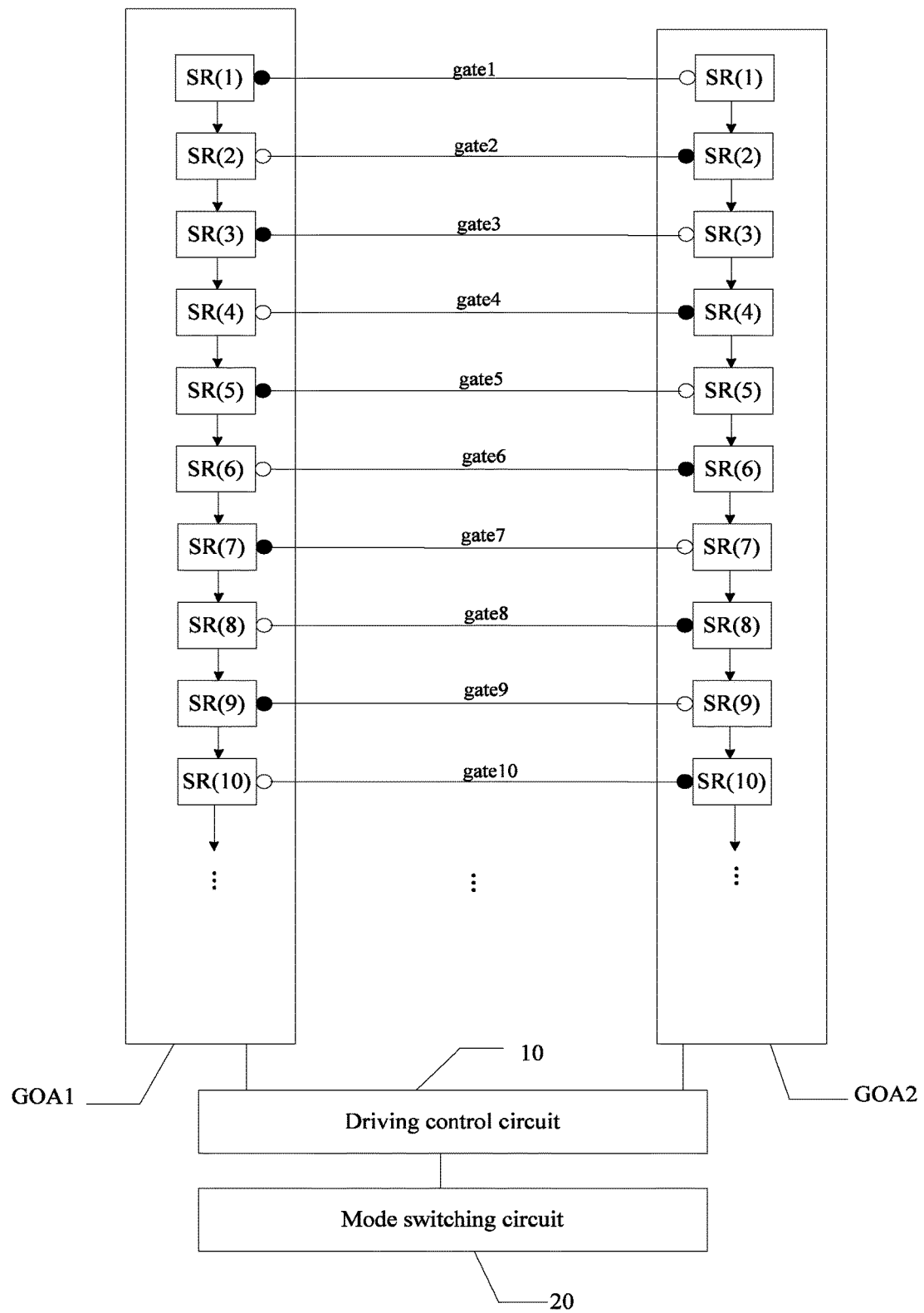
FIG. 9a is a second schematic diagram showing structure of a display panel provided in the embodiments of the present disclosure.

Preferably, as shown in FIG. 9a, the display panel provided in the embodiments of the present disclosure further comprises a mode switching circuit 20 connected to the driving control circuit 10.

Figure 9B:
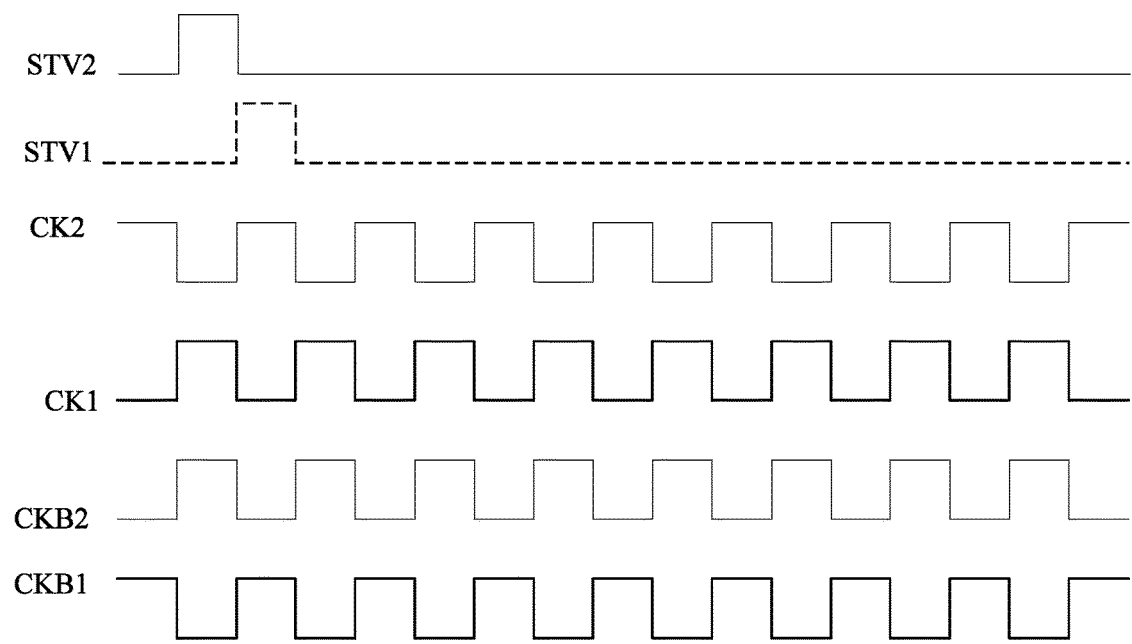
FIG. 9b is a diagram showing timings of two groups of timing control signals outputted by a control driving control circuit when a mode switching circuit receives a first mode control signal or a third mode control signal in the display panel provided in the embodiments of the present disclosure.

Upon receipt of a first mode control circuit, the mode switching circuit 20 controls the driving control circuit 10 to make timings of signals in the first group of timing control signals (at least comprising a first trigger signal STV1, a first clock signal CK1 and a second clock signal CKB1) be delayed a width of a trigger signal relative to timings of corresponding signals in the second group of timing control signals (at least comprising a second trigger signal STV2, a third clock signal CK2 and a fourth clock signal CKB2). Particularly, a diagram of timing sequence of these two groups of timing control signals is shown in FIG. 9b. Therefore, the driving signal output terminals of the shift registers at the respective stages output scan signals sequentially, and the driving signal output terminal of the shift register at a $(n+1)^{th}$ stage in the second driving control circuit outputs a scan signal when the driving signal output terminal of the shift register at a $n^{th}$ stage in the first driving control circuit outputs a scan signal.

In this case, the mode switching circuit 20 further controls the driving control circuit 10 to output the selection control signal to the selection control signal terminals of the shift registers (SR(1), SR(3), SR(5) . . . ) connected to odd-numbered gate lines (gate1, gate3, gate 5 . . . ) in the first gate driving circuit GOA1 and output the selection control signal to the selection control signal terminals of the shift registers (SR(2), SR(4), SR(6) . . . ) connected to even-numbered gate lines (gate2, gate4, gate 6 . . . ) in the second gate driving circuit GOA2. Therefore, the first gate driving circuit GOA1 outputs scan signals to only the odd-numbered gate lines, and the second gate driving circuit GOA2 outputs scan signals to only the even-numbered gate lines, such that two adjacent gate lines in a scanning direction constitute a group of gate lines, respective groups of gate lines receive scan signals sequentially. That is, in the display panel, two gate lines are scanned simultaneously and resolution of the display panel is reduced to ½ of original resolution of the display panel.

Particularly, in FIG. 9a, a black point at a start end of a gate line represents that the selection control signal terminal of the shift register in the gate driving circuit corresponding to the gate line has a selection control signal and the corresponding selection driving output terminal can output a scan signal; a circle at a start end of a gate line represents that the selection control signal terminal of the shift register in the gate driving circuit corresponding to the gate line has no selection control signal and the corresponding selection driving output terminal cannot output a scan signal.

Figure 9C:
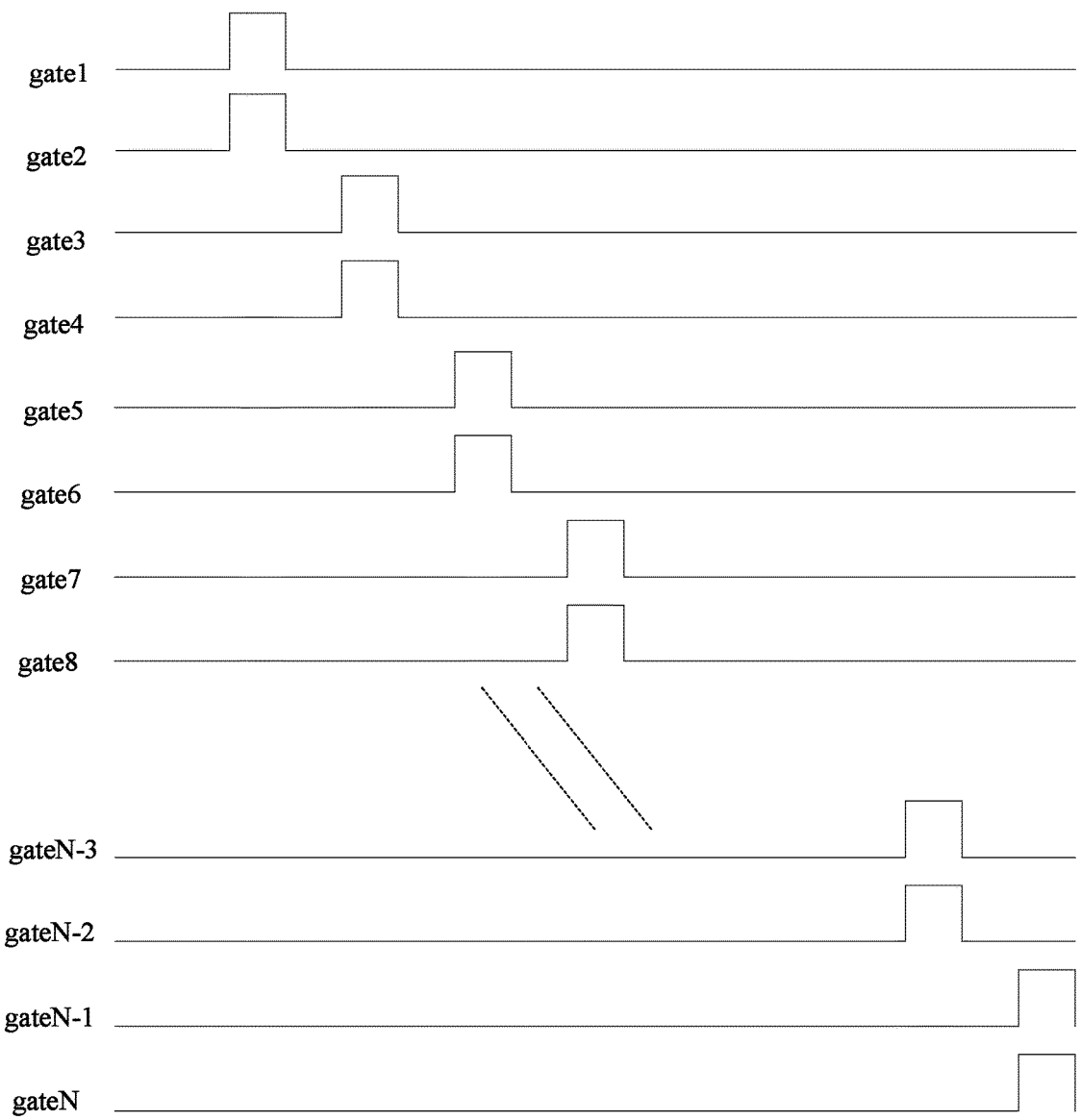
FIG. 9c is a diagram showing timings of scan signals on corresponding gate lines when a mode switching circuit receives a first mode control signal in the display panel provided in the embodiments of the present disclosure.

Particularly, in the display panel provided in the embodiments of the present disclosure, when the mode switching circuit 20 receives the first mode control signal, a diagram of timing sequence of scan signals on respective gate lines in the display panel in the scanning direction is shown in FIG. 9c.

Figure 10A:
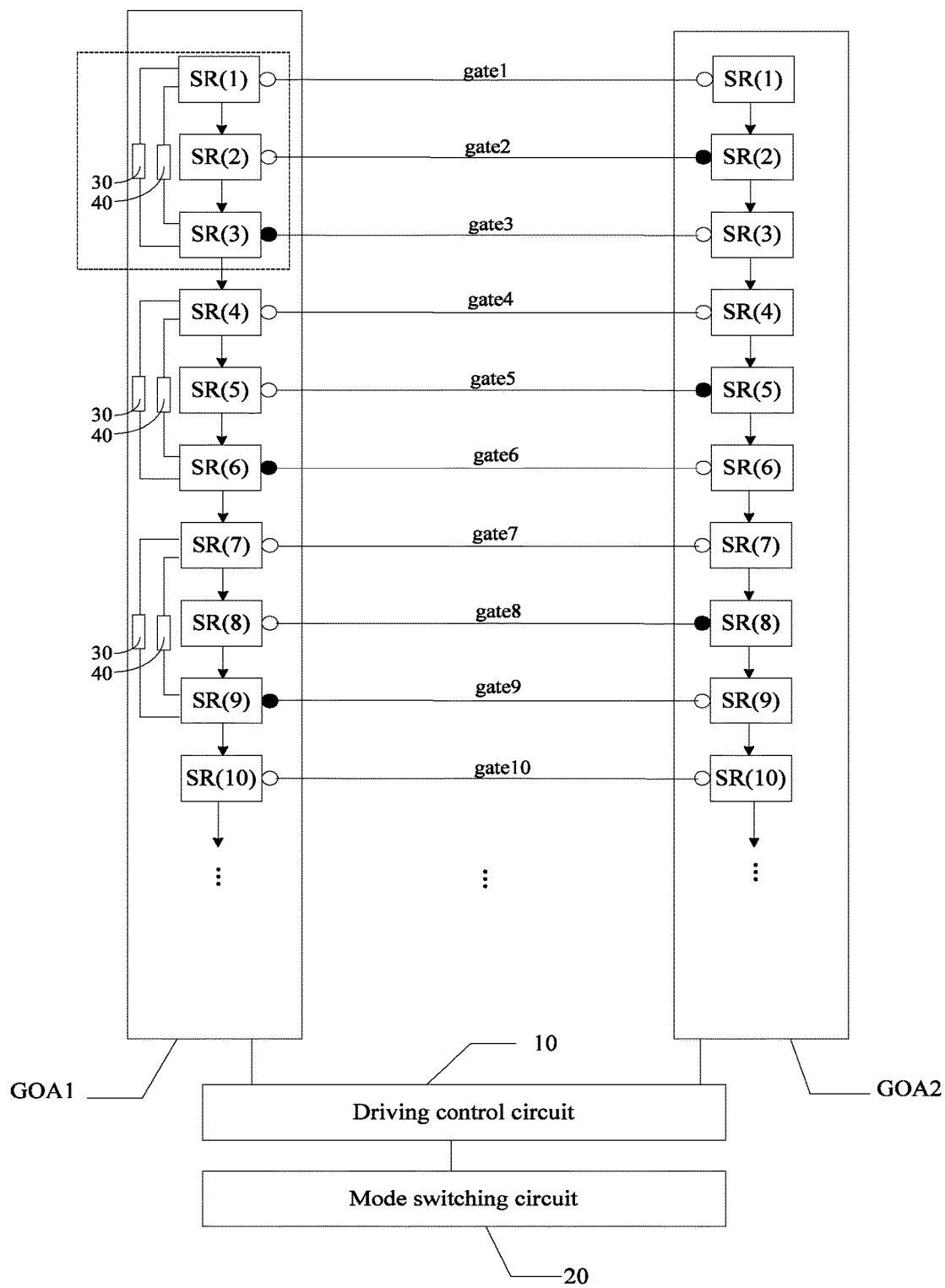
FIG. 10a is a second schematic diagram showing structure of a display panel provided in the embodiments of the present disclosure.
Figure 10B:
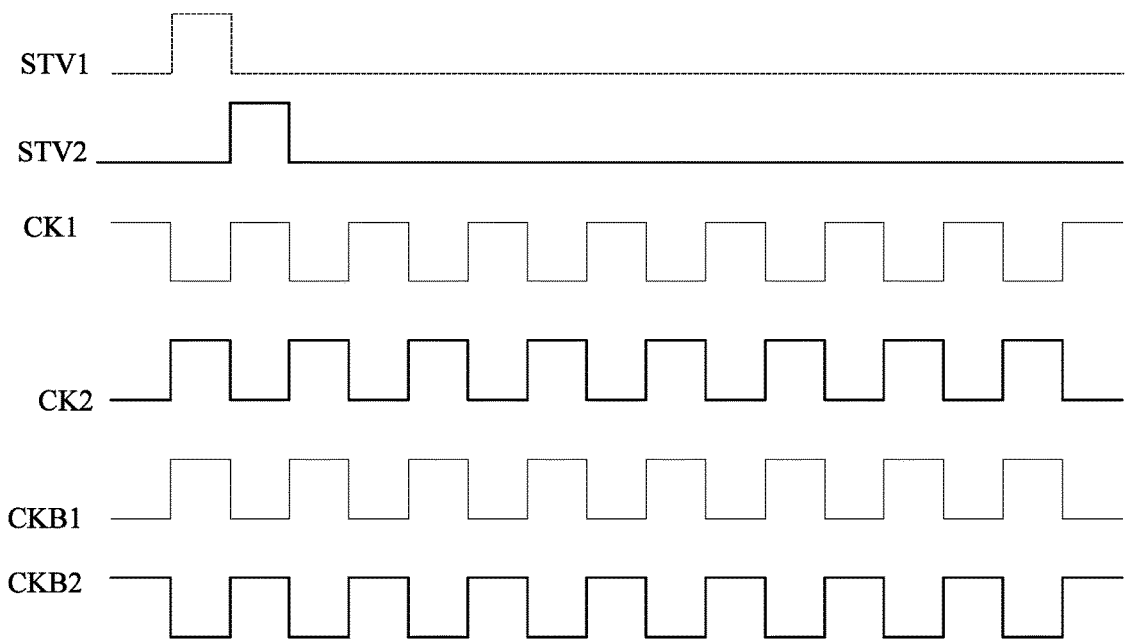
FIG. 10b is a diagram showing timings of two groups of timing control signals outputted by the driving control circuit when a mode switching circuit receives a second mode control signal in the display panel provided in the embodiments of the present disclosure.
Figure 10C:
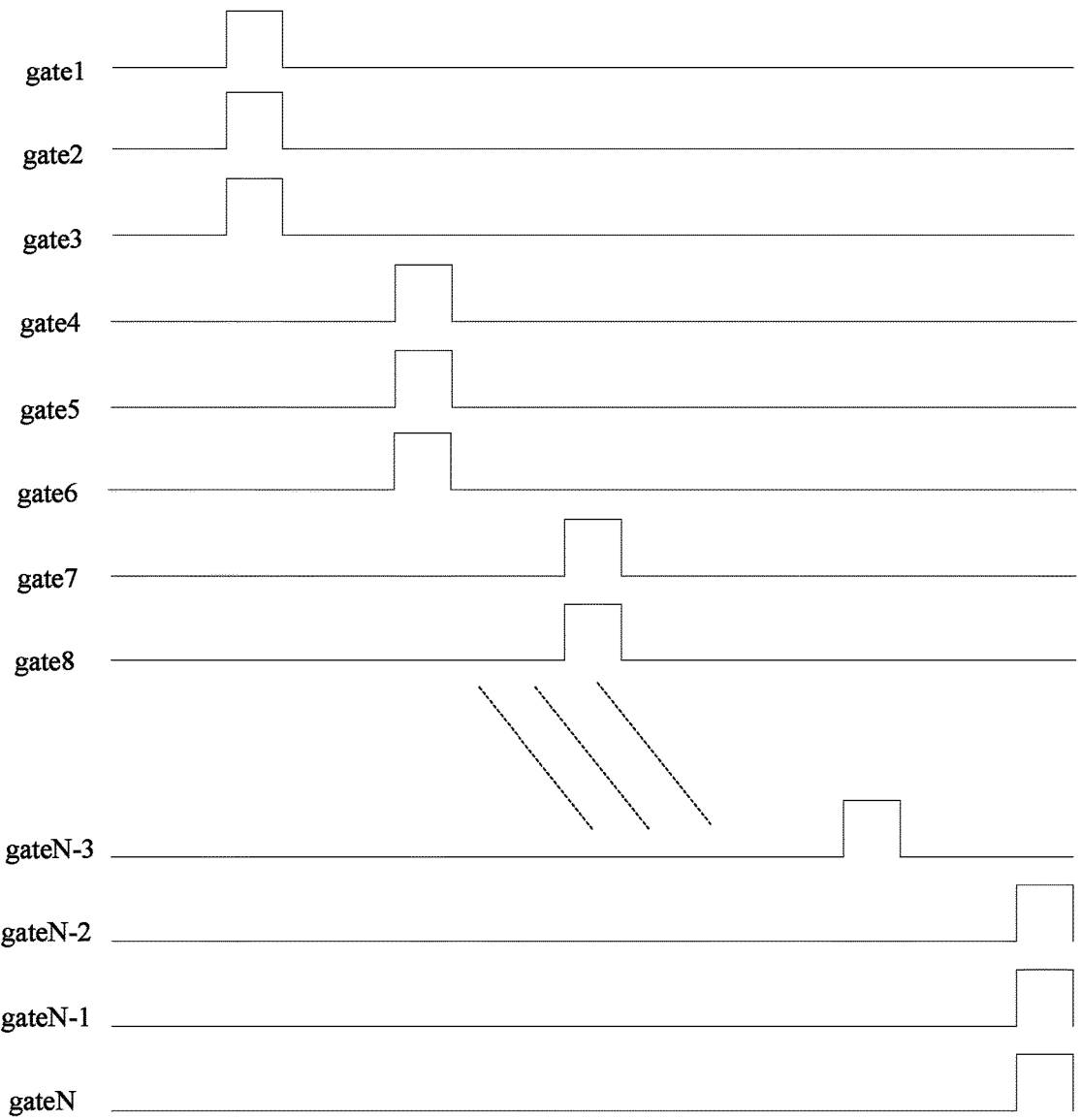
FIG. 10c is a diagram showing timings of scan signals on corresponding gate lines when a mode switching circuit receives a second mode control signal in the display panel provided in the embodiments of the present disclosure.
Figure 10D:
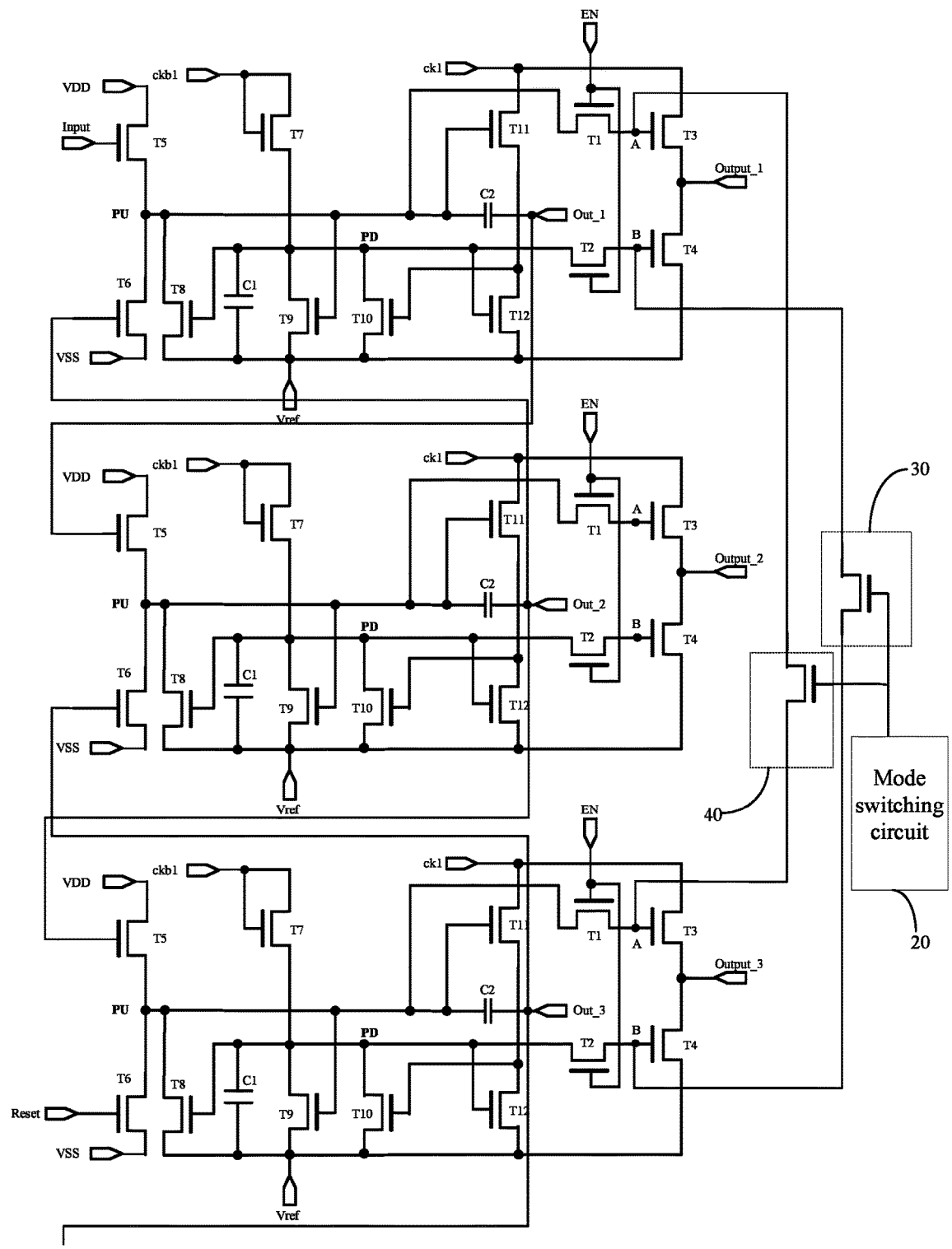

Preferably, as shown in FIG. 10a and FIG. 10d, in the above display panel provided in the embodiments of the present disclosure, the first gate driving circuit GOA1 further comprises a plurality of first switch devices 30 (specific structure is not shown in FIG. 10a, please refer to FIG. 10d) connected between the third nodes A in the shift registers at $(3n-2)^{th}$ stages and the third nodes A in the shift registers at $(3n)^{th}$ stages in the first gate driving circuit GOA1 and a plurality of second switch devices 40 (specific structure is not shown in FIG. 10a, please refer to FIG. 10d) connected between the fourth nodes B in the shift registers at $(3n-2)^{th}$ stages and the fourth nodes B in the shift registers at $(3n)^{th}$ stages in the first gate driving circuit GOA1, where n is an integer larger than 1.

Upon receipt of a second mode control signal, the mode switching circuit 20 controls all of the first switch devices 30 and the second switch devices 40 in an ON state, such that a level at the third node A of the shift register at the $(3n-2)^{th}$ stage is same as that at the third node A of the shift register at the $(3n)^{th}$ stage in the first gate driving circuit GOA1 and a level at the fourth node B of the shift register at the $(3n-2)^{th}$ stage is same as that at the fourth node B of the shift register at the $(3n)^{th}$ stage in the first gate driving circuit GOA1, and a level at the selection driving output terminal Output of the shift register at the $(3n-2)^{th}$ stage is same as that at the selection driving output terminal Output of the shift register at the $(3n)^{th}$ stage in the first gate driving circuit GOA1, where n is an integer larger than 1.

In this case, the mode switching circuit 20 further controls the driving control circuit 10 to make timings of signals in the second group of timing control signals (at least comprising a second trigger signal STV2, a third clock signal CK2 and a fourth clock signal CKB2) be delayed a width of a trigger signal relative to timings of corresponding signals in the first group of timing control signals (at least comprising a first trigger signal STV1, a first clock signal CK1 and a second clock signal CKB1); a diagram of timing sequence of these two groups of timing control signals is particularly shown in FIG. 10b. Therefore, the driving signal output terminals of the shift registers at the respective stages output scan signals sequentially, and the driving signal output terminal of the shift register at a $(j+1)^{th}$ stage in the first driving control circuit outputs a scan signal when the driving signal output terminal of the shift register at a $j^{th}$ stage in the second driving control circuit outputs a scan signal, where j is an integer larger than or equal to 1.

In this case, the mode switching circuit 20 further controls the driving control circuit 10 to output the selection control signal to the selection control signal terminals of the shift registers connected to the $3n^{th}$ gate lines in the first gate driving circuit GOA1 and output the selection control signal to the selection control signal terminals of the shift registers connected to $(3n-1)^{th}$ gate lines in the second gate driving circuit GOA2. Therefore, the first gate driving circuit GOA1 outputs scan signals to only the $3n^{th}$ gate lines, and the second gate driving circuit GOA2 outputs scan signals to only the $(3n-1)^{th}$ gate lines, such that three adjacent gate lines in a scanning direction constitute a group of gate lines, respective groups of gate lines receive scan signals sequentially. That is, in the display panel, three gate lines are scanned simultaneously and resolution of the display panel is reduced to ⅓ of original resolution of the display panel.

Particularly, in FIG. 10a, a black point at a start end of a gate line represents that the selection control signal terminal of the shift register in the gate driving circuit corresponding to the gate line has a selection control signal and the corresponding selection driving output terminal can output a scan signal; a circle at a start end of a gate line represents that the selection control signal terminal of the shift register in the gate driving circuit corresponding to the gate line has no selection control signal and the corresponding selection driving output terminal cannot output a scan signal. Since all of the first switch devices 30 and the second switch devices 40 in the first gate driving circuit GOA1 are in an ON state, the selection driving output terminal of the shift registers at a $(3n-2)^{th}$ stage in the first gate driving circuit GOA1 outputs a same scan signal as the selection driving output terminal of the shift registers at a $(3n)^{th}$ stage.

Particularly, in the display panel provided in the embodiments of the present disclosure, when the mode switching circuit 20 receives the second mode control signal, a diagram of timing sequence of scan signals on respective gate lines in the display panel in the scanning direction is shown in FIG. 10c.

Preferably, in the above display panel provided in the embodiments of the present disclosure, the first gate driving circuit GOA1 comprises a plurality of third switch devices 50 connected between the third nodes A in the shift registers at $(4n-1)^{th}$ stages and the third nodes A in the shift registers at $(4n-3)^{th}$ stages in the first gate driving circuit GOA1 and a plurality of fourth switch devices 60 connected between the fourth nodes B in the shift registers at $(4n-1)^{th}$ stages and the fourth nodes B in the shift registers at $(4n-3)^{th}$ stages in the first gate driving circuit GOA1, the second gate driving circuit GOA2 comprises a plurality of fifth switch devices 70 connected between the third nodes A in the shift registers at $(4n)^{th}$ stages and the third nodes A in the shift registers at $(4n-2)^{th}$ stages in the second gate driving circuit GOA2 and a plurality of sixth switch devices 80 connected between the fourth nodes B in the shift registers at $(4n)^{th}$ stages and the fourth nodes B in the shift registers at $(4n-2)^{th}$ stages in the second gate driving circuit GOA2, where n is an integer larger than or equal to 1.

Upon receipt of a third mode control signal, the mode switching circuit 20 controls all of the first switch devices 30 and the second switch devices 40 in an OFF state, and controls all of the third switch devices 50, the fourth switch devices 60, the fifth switch devices 70 and the sixth switch devices 80 in an ON state, such that a level at the selection driving output terminal Output of the shift register at the $(4n-1)^{th}$ stage is same as that at the selection driving output terminal Output of the shift register at the $(4n-3)^{th}$ stage in the first gate driving circuit GOA1, and a level at the selection driving output terminal Output of the shift register at the $(4n)^{th}$ stage is same as that at the selection driving output terminal Output of the shift register at the $(4n-2)^{th}$ stage in the second gate driving circuit GOA2.

In this case, the mode switching circuit 20 further controls the driving control circuit to make timings of signals in the first group of timing control signals be delayed a width of a trigger signal relative to timings of corresponding signals in the second group of timing control signals. Therefore, the driving signal output terminals of the shift registers at the respective stages output scan signals sequentially, and the driving signal output terminal of the shift register at a $(j+1)^{th}$ stage in the second driving control circuit outputs a scan signal when the driving signal output terminal of the shift register at a $j^{th}$ stage in the first driving control circuit outputs a scan signal.

In this case, the mode switching circuit 20 further controls the driving control circuit 10 to output the selection control signal to the selection control signal terminals of the shift registers at $4n-1^{th}$ stages in the first gate driving circuit GOA1 and output the selection control signal to the selection control signal terminals of the shift registers at $4n^{th}$ stages in the second gate driving circuit GOA2. At this time, as described above, the level at the selection driving output terminal Output of the shift register at the $(4n-1)^{th}$ stage is same as that at the selection driving output terminal Output of the shift register at the $(4n-3)^{th}$ stage in the first gate driving circuit GOA1, and the level at the selection driving output terminal Output of the shift register at the $(4n)^{th}$ stage is same as that at the selection driving output terminal Output of the shift register at the $(4n-2)^{th}$ stage in the second gate driving circuit GOA2. Therefore, the first gate driving circuit GOA1 t outputs scan signals to the $(4n-1)^{th}$ gate lines and the $(4n-3)^{th}$ gate lines simultaneously, and the second gate driving circuit GOA2 outputs scan signals to the $(4n)^{th}$ gate lines and the $(4n-2)^{th}$ gate lines simultaneously, such that four adjacent gate lines in a scanning direction constitute a group of gate lines, respective groups of gate lines receive scan signals sequentially. That is, in the display panel, four gate lines are scanned simultaneously and resolution of the display panel is reduced to ¼ of original resolution of the display panel.

Figure 11A:
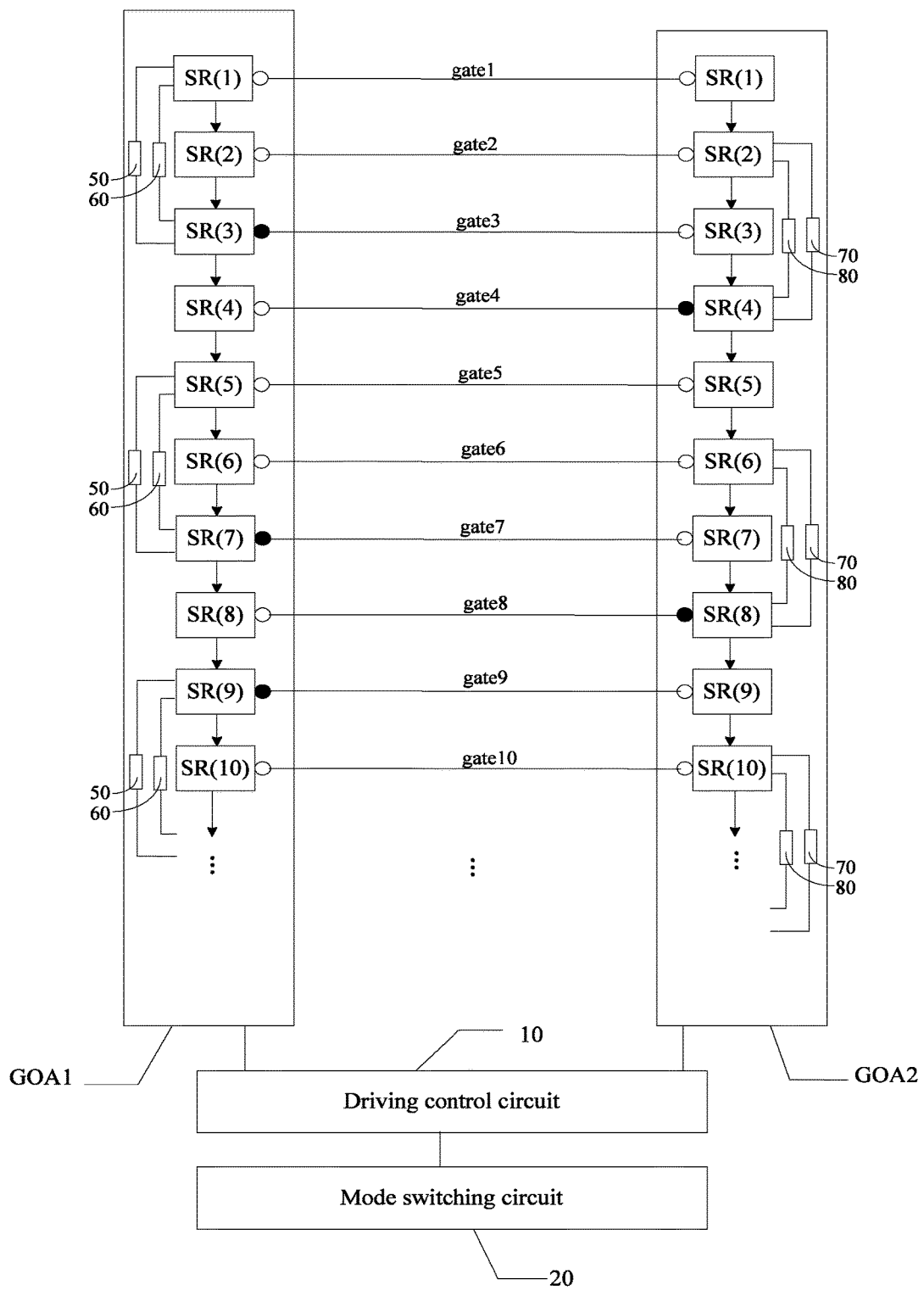
FIG. 11a is a third schematic diagram showing structure of a display panel provided in the embodiments of the present disclosure.
Figure 11B:
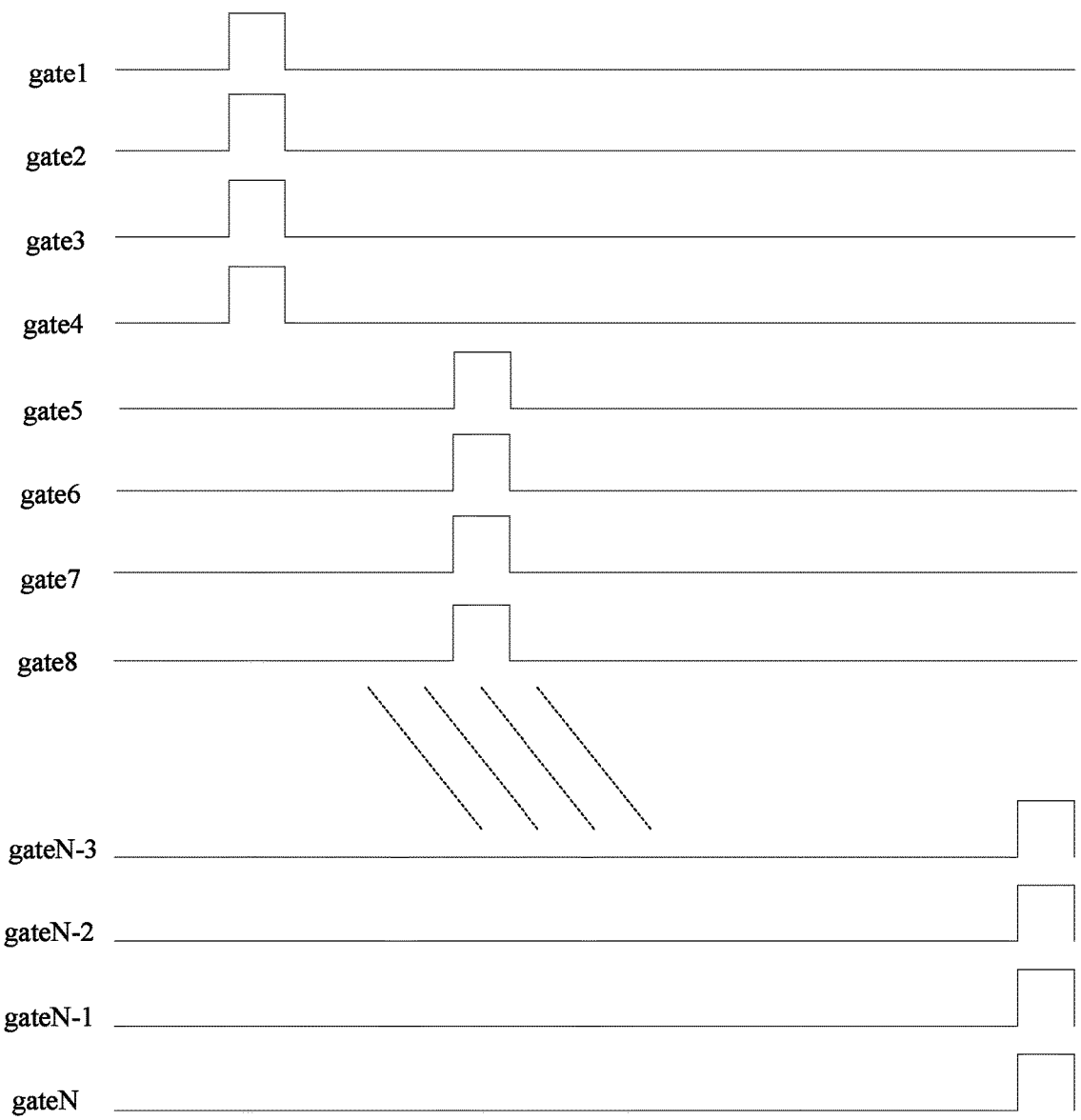
FIG. 11b is a diagram showing timings of scan signals on corresponding gate lines when a mode switching circuit receives a third mode control signal in the display panel provided in the embodiments of the present disclosure.

Particularly, in the display panel provided in the embodiments of the present disclosure, when the mode switching circuit 20 receives the third mode control signal, a diagram of timing sequence of scan signals on respective gate lines in the display panel in the scanning direction is shown in FIG. 11b.

Preferably, in the above display panel provided in the embodiments of the present disclosure, upon receipt of a fourth mode control signal, the mode switching circuit 20 controls all of the switch devices in an OFF state, so as to ensure that there is no interaction among signals on the respective gate lines.

In this case, the mode switching circuit 20 further controls the driving control circuit 10 to make timings of signals in the second group of timing control signals be same as timings of corresponding signals in the first group of timing control signals. Therefore, the driving signal output terminal of the shift register at a $n^{th}$ stage in the second driving control circuit outputs a scan signal when the driving signal output terminal of the shift register at a $n^{th}$ stage in the first driving control circuit outputs a scan signal.

In this case, the mode switching circuit 20 further controls the driving control circuit 10 to output the selection control signal to the selection control signal terminals of all of the shift registers. Therefore, the first gate driving circuit outputs scan signals to N gate lines sequentially, the second gate driving circuit outputs scan signals to N gate lines sequentially, such that a function of progressive scanning in the scanning direction can be achieved, that is, the display panel has a high resolution. The display panel provided in the embodiments of the present disclosure not only can implement a low resolution display when there is a need to save power but also can implement a high resolution display when there is no need to save power.

Figure 12:
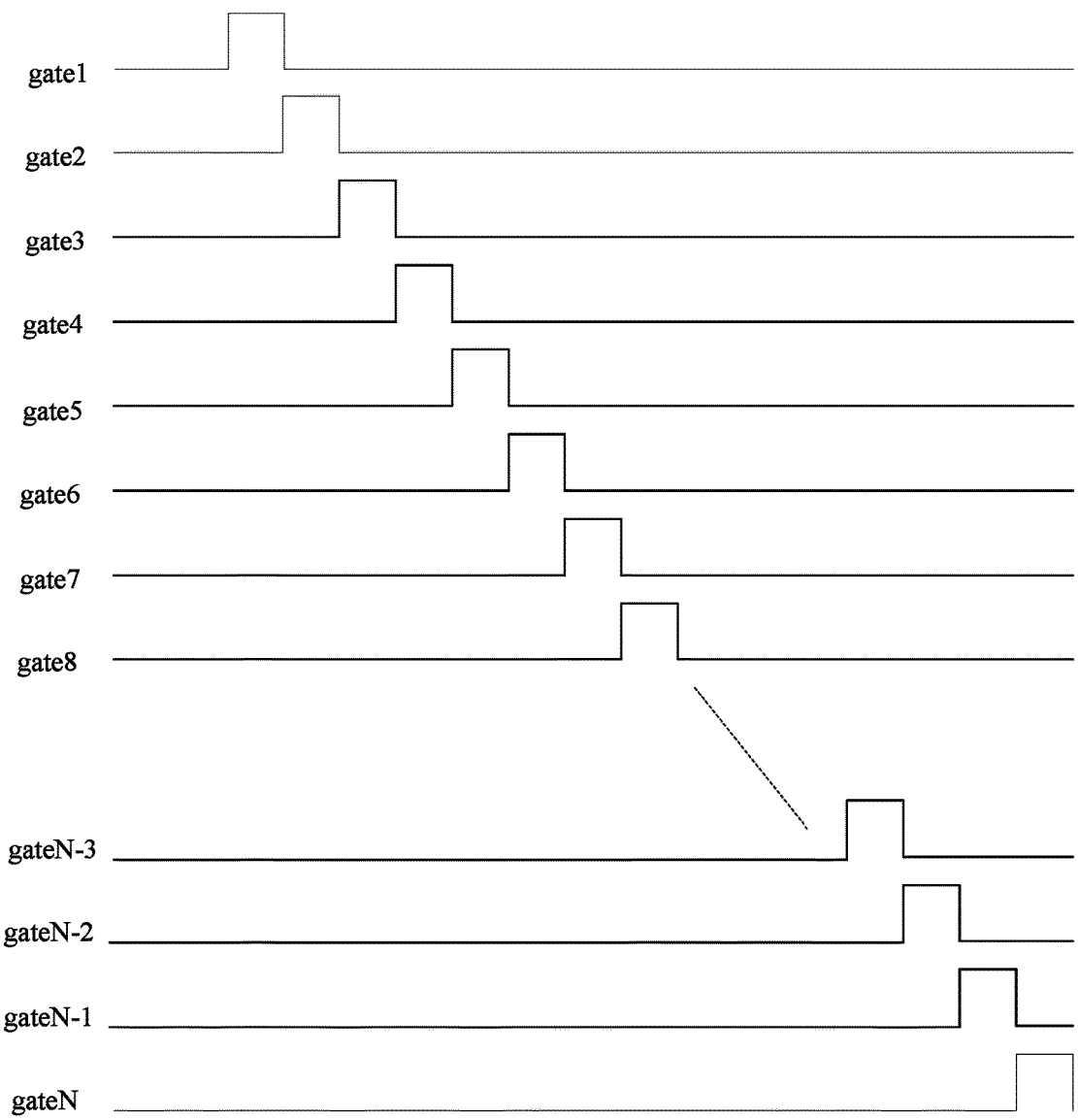
FIG. 12 is a diagram showing timings of scan signals on corresponding gate lines when a mode switching circuit receives a fourth mode control signal in the display panel provided in the embodiments of the present disclosure.

Particularly, in the display panel provided in the embodiments of the present disclosure, when the mode switching circuit 20 receives the fourth mode control signal, a diagram of timing sequence of scan signals on respective gate lines in the display panel in the scanning direction is shown in FIG. 12.

It should be explained that, in the display panel provided in the embodiments of the present disclosure, for the first mode control signal, the second mode control signal, the third mode control signal and the fourth mode control signal, a duration of the respective mode control signals is an integral multiple of a time length necessary for scanning N gate lines, and a switching point between any two mode control signals is synchronized with a starting point of gate line scanning.

Furthermore, in the display panel provided in the embodiments of the present disclosure, the switch devices may be switching transistors or other electronic switch control modules, no limitation is made herein.

Specifically, in the display panel provided in the embodiments of the present disclosure, the purpose of reducing resolution can be achieved by setting the output control unit, the second pull-up unit and the second pull-down unit in the shift register, adding the switch devices among the shift registers, and controlling timing sequence of the two groups of timing control signals. Although only four cases are illustrated in the embodiments of the present disclosure, it should be understood that the display panel obtained based on the above inventive concept and capable of implementing ⅕ resolution, ⅙ resolution and so on falls into the protection scope of the present disclosure.

In specific implementation, with the display panel provided in the embodiments of the present disclosure, a user can send a mode control signal to the mode switching circuit through an operational interface of the display panel according to actual requirement, no limitation is made herein.

Furthermore, the display panel provided in the embodiments of the present disclosure may be a liquid crystal display panel or an organic electro-luminescence light emitting display panel, no limitation is made herein.

Based on the same inventive concept, the display device provided in the embodiments of the present disclosure comprises any of the display panel provided above in the embodiments of the present disclosure. The display device may be any product or component with a display function such as a mobile phone, a tablet computer, a television, a display, a notebook computer, a digital photo frame, a navigator and so on. For implementation of the display device, please refer to the implementation of the display panel described above, details omitted.

Based on the same inventive concept, the method for driving the display panel provided in the embodiments of the present disclosure comprises:

upon receipt of a first mode control circuit, the mode switching circuit controls all of the switch devices in an OFF state, controls the driving control circuit to make timings of signals in the first group of timing control signals be delayed a width of a trigger signal relative to timings of corresponding signals in the second group of timing control signals, and controls the driving control circuit to output the selection control signal to the selection control signal terminals of the shift registers connected to odd-numbered gate lines in the first gate driving circuit and output the selection control signal to the selection control signal terminals of the shift registers connected to even-numbered gate lines in the second gate driving circuit;

upon receipt of a second mode control signal, the mode switching circuit controls all of the first switch devices and the second switch devices in an ON state, controls all of the third switch devices, the fourth switch devices, the fifth switch devices and the sixth switch devices in an OFF state, controls the driving control circuit to make timings of signals in the second group of timing control signals be delayed a width of a trigger signal relative to timings of corresponding signals in the first group of timing control signals, and controls the driving control circuit to output the selection control signal to the selection control signal terminals of the shift registers connected to the $3n^{th}$ gate lines in the first gate driving circuit and output the selection control signal to the selection control signal terminals of the shift registers connected to the $3n-1^{th}$ gate lines in the second gate driving circuit, where n is an integer larger than or equal to 1;

upon receipt of a third mode control signal, the mode switching circuit controls all of the first switch devices and the second switch devices in an OFF state, controls all of the third switch devices, the fourth switch devices, the fifth switch devices and the sixth switch devices in an ON state, controls the driving control circuit to make timings of signals in the first group of timing control signals be delayed a width of a trigger signal relative to timings of corresponding signals in the second group of timing control signals, and controls the driving control circuit to output the selection control signal to the selection control signal terminals of the shift registers connected to the $4n-1^{th}$ gate lines in the first gate driving circuit and output the selection control signal to the selection control signal terminals of the shift registers connected to the $4n^{th}$ gate lines in the second gate driving circuit;

upon receipt of a fourth mode control signal, the mode switching circuit controls all of the switch devices in an OFF state, controls the driving control circuit to make timings of signals in the second group of timing control signals be same as timings of corresponding signals in the first group of timing control signals, and controls the driving control circuit to output the selection control signal to the selection control signal terminals of all of the shift registers.

In the shift register, the gate driving circuit, the display panel and the method for driving the display panel provided in the embodiments of the present disclosure, the output control unit, the second pull-up unit, the second pull-down unit and the selection control signal terminal are added on the basis of the shift register in the prior art, wherein the output control unit is configured to connect the first node to the third node and connects the second node to the fourth node when the selection control signal terminal receives the selection control signal, the second pull-up unit is configured to supply the signal at the first clock signal terminal to the selection driving output terminal under the control of the third node, the second pull-down unit is configured to supply the signal at the reference signal terminal to the selection driving output terminal under the control of the fourth node. Dependent on the control of the output control unit, the second pull-up unit, the second pull-down unit and the selection control signal terminal, it is determined whether a driving output terminal should output a scan signal. In the gate driving circuit constituted by the above shift registers, the scan signals can be outputted to a part of gate lines selectively. In the display panel provided in the embodiments of the present disclosure which adopts the above gate driving circuit, switch devices each of which is connected between the third nodes of two shift registers, switch devices each of which is connected between the fourth nodes of two shift registers and the mode switching circuit connected to the driving control circuit are incorporated. As such, when the mode switching circuit receives different mode control signals, it makes the display panel display in different resolutions, such that the power consumption of the display panel can be reduced selectively to prolong standby time.

Obviously, those skilled in the art can make various changes or variations to the embodiments of the present disclosure without departing from the spirit and scope of the present invention. In this way, as long as those modifications and variations to the embodiments of the present disclosure are within the scope of the claims of the present invention and the equivalence thereof, the present invention is also intended to cover these changes and variation.

The present disclosure claims priority on a Chinese patent application entitled "shift register, method for driving display panel and associated device" with an application number No. 201510477631.7 filed on Aug. 6, 2015, which is incorporated herein in its entity by reference.

What is claimed is:

1. A shift register, comprising a first pull-up unit, a first pull-down unit, an output control unit, a second pull-up unit and a second pull-down unit, wherein the first pull-up unit is connected to a first node, a first clock signal terminal and a driving signal output terminal, and supplies a signal at the first clock signal terminal to the driving signal output terminal under a control of the first node;

the first pull-down unit is connected to a second node, a reference signal terminal and the driving signal output terminal, and supplies a signal at the reference signal terminal to the driving signal output terminal under a control of the second node;

the output control unit is connected to the first node, the second node, a selection control signal terminal, a third node and a fourth node, and connects the first node to the third node and connects the second node to the fourth node when the selection control signal terminal receives a selection control signal;

the second pull-up unit is connected to the third node, the first clock signal terminal and a selection driving output terminal, and supplies the signal at the first clock signal terminal to the selection driving output terminal under a control of the third node; and the second pull-down unit is connected to the fourth node, the reference signal terminal and the selection driving output terminal, and supplies the signal at the reference signal terminal to the selection driving output terminal under a control of the fourth node.

2. The shift register according to claim 1, wherein the output control unit comprises: a first switching transistor and a second switching transistor, wherein a gate of the first switching transistor is connected to the selection control signal terminal, a source of the first switching transistor is connected to the first node, and a drain of the first switching transistor is connected to the third node;

a gate of the second switching transistor is connected to the selection control signal terminal, a source of the second switching transistor is connected to the second node, and a drain of the first switching transistor is connected to the fourth node.

3. The shift register according to claim 1, wherein the second pull-up unit comprises: a third switching transistor, wherein a gate of the third switching transistor is connected to the third node, a source of the third switching transistor is connected to the first clock signal terminal, and a drain of the third switching transistor is connected to the selection driving output terminal.

4. The shift register according to claim 1, wherein the second pull-down unit comprises: a fourth switching transistor, wherein
a gate of the fourth switching transistor is connected to the fourth node, a source of the fourth switching transistor is connected to the reference signal terminal, and a drain of the fourth switching transistor is connected to the selection driving output terminal.

5. A gate driving circuit, comprising a plurality of shift registers of claim 1 connected in cascade, wherein
the shift register further comprises an input unit and a reset unit, the input unit is connected to an input signal terminal and the first node, the reset unit is connected to a reset signal terminal and the first node;
except the shift register at a last stage, the driving signal output terminal of the shift register at each stage is connected to an input signal terminal of the shift register at its adjacent next stage;
an signal input terminal of the shift register at a first stage receives a trigger signal;
except the shift register at the first stage, the driving signal output terminal of the shift register at each stage is connected to a reset signal terminal of the shift register at its adjacent previous stage;
the selection driving output terminal of the shift register at each stage is connected to its corresponding gate line.

6. The gate driving circuit of claim 5, further comprising:
a plurality of first switch devices wherein a $k^{th}$ first switch device is connected to a first switch control terminal, the third node in the shift register at a $3k-2^{th}$ stage and the third node in the shift register at a $3k^{th}$ stage, and connects the third node in the shift register at the $3k-2^{th}$ stage to the third node in the shift register at the $3k^{th}$ stage under a control of the first switch control terminal; and
a plurality of second switch devices, wherein a $k^{th}$ second switch device is connected to the first switch control terminal, the fourth node in the shift register at a $3k-2^{th}$ stage and the fourth node in the shift register at a $3k^{th}$ stage, and connects the fourth node in the shift register at the $3k-2^{th}$ stage to the fourth node in the shift register at the $3k^{th}$ stage under a control of the first switch control terminal,
wherein k is an integer larger than or equal to 1.

7. The gate driving circuit of claim 5, further comprising:
a plurality of third switch devices, wherein a $n^{th}$ third switch device is connected to a second switch control terminal, the third node in the shift register at a $4n-3^{th}$ stage and the third node in the shift register at a $4n-1^{th}$ stage, and connects the third node in the shift register at the $4n-3^{th}$ stage to the third node in the shift register at the $4n-1^{th}$ stage under a control of the second switch control terminal; and
a plurality of fourth switch devices, wherein a $n^{th}$ fourth switch device is connected to the second switch control terminal, the fourth node in the shift register at a $4n-3^{th}$ stage and the fourth node in the shift register at a $4n-1^{th}$ stage, and connects the fourth node in the shift register at the $4n-3^{th}$ stage to the fourth node in the shift register at the $4n-1^{th}$ stage under a control of the second switch control terminal, wherein n is an integer larger than or equal to 1.

8. The gate driving circuit of claim 5, further comprising:
a plurality of fifth switch devices wherein a $n^{th}$ fifth switch device is connected to a third switch control terminal, the third node in the shift register at a $4n-2^{th}$ stage and the third node in the shift register at a $4n^{th}$ stage, and connects the third node in the shift register at the $4n-2^{th}$ stage to the third node in the shift register at the $4n^{th}$ stage under a control of the third switch control terminal; and
a plurality of sixth switch devices, wherein a $n^{th}$ sixth switch device is connected to the third switch control terminal, the fourth node in the shift register at a $4n-2^{th}$ stage and the fourth node in the shift register at a $4n^{th}$ stage, and connects the fourth node in the shift register at the $4n-2^{th}$ stage to the fourth node in the shift register at the $4n^{th}$ stage under a control of the third switch control terminal,
wherein n is an integer larger than or equal to 1.

9. A display panel, comprising N gate lines and a first gate driving circuit and a second gate driving circuit located at both sides of the display panel and connected to the N gate lines; the first gate driving circuit and the second gate driving circuit are the gate driving circuit of claim 5, the selection driving output terminal of each of the shift registers in each of the gate driving circuits is connected to its corresponding gate line,
the display panel further comprises a driving control circuit, wherein the driving control circuit is connected to the first gate driving circuit and the second gate driving circuit, outputs the selection control signal to the first gate driving circuit and the second gate driving circuit, outputs a first group of timing control signals to the first gate driving circuit, and outputs a second group of timing control signals to the second gate driving circuit,
wherein the first group of timing control signals at least comprise a first trigger signal and a first clock signal, the second group of timing control signals at least comprise a second trigger signal and a third clock signal, a width of the first trigger signal is same as a width of the second trigger signal, the first gate driving circuit outputs scan signals at the driving signal output terminals of the shift registers at respective stages sequentially under a control of the first group of timing control signals, the second gate driving circuit outputs scan signals at the driving signal output terminals of the shift registers at respective stages sequentially under a control of the second group of timing control signals.

10. The display panel of claim 9, further comprising: a mode switching circuit connected to the driving control circuit, wherein upon receipt of a first mode control signal, the mode switching circuit
controls the driving control circuit to make timings of signals in the first group of timing control signals be delayed a width of a trigger signal relative to timings of corresponding signals in the second group of timing control signals; and
controls the driving control circuit to output the selection control signal to the selection control signal terminals of the shift registers at odd stages in the first gate driving circuit and output the selection control signal to the selection control signal terminals of the shift registers at even stages in the second gate driving circuit.

11. The display panel of claim 10, wherein the first gate driving circuit further comprises:
- a plurality of first switch devices wherein a $k^{th}$ first switch device is connected to first switch control terminal in the first-gate driving circuit, the third node in the shift register at a $3k\text{-}2^{th}$ stage and the third node in the shift register at a $3k^{th}$ stage in the first gate driving circuit, and connects the third node in the shift register at the $3k\text{-}2^{th}$ stage to the third node in the shift register at the $3k^{th}$ stage under a control of the first switch control terminal; and
- a plurality of second switch devices, wherein a $k^{th}$ second switch device is connected to the first switch control terminal, the fourth node in the shift register at a $3k\text{-}2^{th}$ stage in the first gate driving circuit and the fourth node in the shift register at a $3k^{th}$ stage in the first gate driving circuit, and connects the fourth node in the shift register at the $3k\text{-}2^{th}$ stage to the fourth node in the shift register at the $3k^{th}$ stage under a control of the first switch control terminal,
- wherein k is an integer larger than or equal to 1,
- upon receipt of a second mode control signal, the mode switching circuit controls all of the first switch devices and the second switch devices in an ON state, controls the driving control circuit to make timings of signals in the second group of timing control signals be delayed a width of a trigger signal relative to timings of corresponding signals in the first group of timing control signals; and controls the driving control circuit to output the selection control signal to the selection control signal terminals of the shift registers at $3k^{th}$ stages in the first gate driving circuit and output the selection control signal to the selection control signal terminals of the shift registers at $3k\text{-}1^{th}$ stages in the second gate driving circuit.

12. The display panel of claim 10, wherein the first gate driving circuit further comprises:
- a plurality of third switch devices, wherein a $n^{th}$ third switch device is connected to a second switch control terminal, the third node in the shift register at a $4n\text{-}3^{th}$ stage in the first gate driving circuit and the third node in the shift register at a $4n\text{-}1^{th}$ stage in the first gate driving circuit, and connects the third node in the shift register at the $4n\text{-}3^{th}$ stage to the third node in the shift register at the $4n\text{-}1^{th}$ stage under a control of the second switch control terminal; and
- a plurality of fourth switch devices, wherein a $n^{th}$ fourth switch device is connected to the second switch control terminal, the fourth node in the shift register at a $4n\text{-}3^{th}$ stage in the first gate driving circuit and the fourth node in the shift register at a $4n\text{-}1^{th}$ stage in the first gate driving circuit, and connects the fourth node in the shift register at the $4n\text{-}3^{th}$ stage to the fourth node in the shift register at the $4n\text{-}1^{th}$ stage under a control of the second switch control terminal, the second gate driving circuit further comprises:
- a plurality of fifth switch devices, wherein a $n^{th}$ fifth switch device is connected to a third switch control terminal the third node in the shift register at a $4n\text{-}2^{th}$ stage in the second gate driving circuit and the third node in the shift register at a $4n^{th}$ stage in the second gate driving circuit, and connects the third node in the shift register at the $4n\text{-}2^{th}$ stage to the third node in the shift register at the $4n^{th}$ stage under a control of the third switch control terminal; and
- a plurality of sixth switch devices, wherein a $n^{th}$ sixth switch device is connected to the third switch control terminal, the fourth node in the shift register at a $4n\text{-}2^{th}$ stage in the second gate driving circuit and the fourth node in the shift register at a $4n^{th}$ stage in the second gate driving circuit, and connects the fourth node in the shift register at the $4n\text{-}2^{th}$ stage to the fourth node in the shift register at the $4n^{th}$ stage under a control of the third switch control terminal,
- wherein n is an integer larger than or equal to 1,
- upon receipt of a third mode control signal, the mode switching circuit controls all of the third switch devices, the fourth switch devices, the fifth switch devices and the sixth switch devices in an ON state, controls the driving control circuit to make timings of signals in the first group of timing control signals be delayed a width of a trigger signal relative to timings of corresponding signals in the second group of timing control signals; and controls the driving control circuit to output the selection control signal to the selection control signal terminals of the shift registers at $4n\text{-}1^{th}$ stages in the first gate driving circuit and output the selection control signal to the selection control signal terminals of the shift registers at $4n^{th}$ stages in the second gate driving circuit.

13. The display panel of claim 10, wherein upon receipt of a fourth mode control signal, the mode switching circuit controls the driving control circuit to make timings of signals in the second group of timing control signals be same as timings of corresponding signals in the first group of timing control signals; and controls the driving control circuit to output the selection control signal to the selection control signal terminals of all of the shift registers.

* * * * *